(12) United States Patent
Shu et al.

(10) Patent No.: US 10,697,778 B2
(45) Date of Patent: Jun. 30, 2020

(54) INDOOR NAVIGATION

(71) Applicant: Microsoft Technology Licensing, LLC, Redmond, WA (US)

(72) Inventors: Yuanchao Shu, Beijing (CN); Börje Felipe Fernandes Karlsson, Beijing (CN); Thomas Moscibroda, Beijing (CN); Yundie Zhang, Beijing (CN); Zhuqi Li, Beijing (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/259,025

(22) Filed: Sep. 7, 2016

(65) Prior Publication Data
US 2018/0066944 A1   Mar. 8, 2018

(51) Int. Cl.
*G01C 21/20* (2006.01)
*G01C 5/06* (2006.01)
*G01R 33/02* (2006.01)
*G01C 22/00* (2006.01)

(52) U.S. Cl.
CPC .......... *G01C 21/206* (2013.01); *G01C 5/06* (2013.01); *G01C 22/006* (2013.01); *G01R 33/02* (2013.01)

(58) Field of Classification Search
CPC ........ G01C 21/206; G01C 5/06; G01C 19/00; G01P 15/00; G01R 33/02
See application file for complete search history.

(56) References Cited

U.S. PATENT DOCUMENTS

| | | | |
|---|---|---|---|
| 6,917,893 B2 | 7/2005 | Dietsch et al. | |
| 7,058,506 B2 * | 6/2006 | Kawase | G01C 21/14 701/410 |
| 7,991,576 B2 | 8/2011 | Roumeliotis | |
| 8,498,811 B2 | 7/2013 | Lundquist et al. | |

(Continued)

FOREIGN PATENT DOCUMENTS

| | | |
|---|---|---|
| CN | 102484767 A | 5/2012 |
| CN | 103363988 A | 10/2013 |

(Continued)

OTHER PUBLICATIONS

Riehle, et al., "Indoor Waypoint Navigation via Magnetic Anomalies", In Proceedings of 33rd Annual International Conference of the IEEE Engineering in Medicine and Biology Society, Aug. 30, 2011, 4 pages.

(Continued)

*Primary Examiner* — Nicholas Kiswanto

(57) ABSTRACT

In accordance with implementations of the subject matter described herein, a new approach for creating a navigation trace is proposed. In these implementations, a reference signal is obtained, where the reference signal includes time series data collected by at least one environment sensor along a reference path from a start point to a destination. Then, a navigation trace is created for the reference path based on the obtained reference signal, where magnitudes at locations of the navigation trace reflect measurements collected by the at least one environment sensor at respective time points of the reference signal. In accordance with implementations of the subject matter described herein, a new approach for generating a navigation instruction from a navigation trace.

20 Claims, 10 Drawing Sheets

(56) References Cited

U.S. PATENT DOCUMENTS

| | | | |
|---|---|---|---|
| 8,688,403 | B2 | 4/2014 | Oka et al. |
| 9,733,091 | B2* | 8/2017 | Kordari ................ G01C 21/206 |
| 9,832,617 | B1* | 11/2017 | Mayor .................. H04W 4/027 |
| 9,995,585 | B2* | 6/2018 | Altinger ............... G01C 21/206 |
| 2007/0018890 | A1 | 1/2007 | Kulyukin |
| 2009/0005018 | A1 | 1/2009 | Forstall et al. |
| 2010/0268454 | A1 | 10/2010 | Fountain |
| 2010/0318293 | A1 | 12/2010 | Brush et al. |
| 2011/0046878 | A1* | 2/2011 | Sung .................. G01C 21/3647 |
| | | | 701/467 |
| 2014/0378159 | A1* | 12/2014 | Dolbakian .......... H04W 64/006 |
| | | | 455/456.1 |
| 2015/0160018 | A1 | 6/2015 | Ameling et al. |
| 2015/0181372 | A1* | 6/2015 | Huang .................. H04W 4/029 |
| | | | 455/456.1 |
| 2015/0256977 | A1* | 9/2015 | Huang .................. H04W 4/029 |
| | | | 455/456.3 |
| 2016/0171377 | A1 | 6/2016 | Caritu et al. |
| 2016/0187141 | A1* | 6/2016 | Kulkarni ................ H04W 4/21 |
| | | | 701/537 |
| 2016/0223340 | A1 | 8/2016 | Shin et al. |
| 2016/0334218 | A1* | 11/2016 | Heshmati ............. G01C 21/165 |
| 2017/0023937 | A1* | 1/2017 | Loianno ................ G08G 5/003 |
| 2017/0227571 | A1* | 8/2017 | Theytaz ................ G01R 33/02 |
| 2017/0307382 | A1* | 10/2017 | Kim ..................... G01C 21/206 |
| 2019/0195635 | A1 | 6/2019 | Shu et al. |

FOREIGN PATENT DOCUMENTS

| | | | |
|---|---|---|---|
| CN | 103900582 | A | 7/2014 |
| CN | 104949675 | A | 9/2015 |
| CN | 105043387 | A | 11/2015 |
| CN | 105318868 | A | 2/2016 |
| WO | 2015065418 | A1 | 5/2015 |

OTHER PUBLICATIONS

Purohit, et al., "SugarTrail: Indoor Navigation in Retail Environments without Surveys and Maps", In Proceedings of IEEE International Conference on Sensing, Communications and Networking, Jun. 24, 2013, 9 pages.

Faragher, et al., "SmartSLAM—an efficient smartphone indoor positioning system exploiting machine learning and opportunistic sensing", In Proceedings of the 26th International Technical Meeting of the Satellite Division of the Institute of Navigation, Sep. 16, 2013, 14 pages.

Evennou, et al., "Advanced Integration of WiFi and Inertial Navigation Systems for Indoor Mobile Positioning", In EURASIP Journal on Applied Signal Processing, Jan. 2006, pp. 1-11.

Rai, et al., "Zee: Zero-Effort Crowdsourcing for Indoor Localization", In Proceedings of 18th annual international conference on Mobile computing and networking, Aug. 22, 2012, 12 pages.

Hogg, et al., "Sensors and Algorithms for Small Robot Leader/Follower Behavior", In Proceedings of SPIE AeroSense Symposium, Sep. 2001, 14 pages.

Kim, et al., "Implementation of a Leader-following Mobile Robot System Based on GPS and Bluetooth Communication", In Proceedings of Joint 5th International Conference on Soft Computing and Intelligent Systems and 11th International Symposium on Advanced Intelligent Systems, Dec. 8, 2010, pp. 914-919.

Chung, et al., "Indoor Location Sensing Using Geo-Magnetism", In Proceedings of the 9th international conference on Mobile systems, applications, and services, Jun. 28, 2011, pp. 141-154.

Galvan-Tejada, et al., "Magnetic Field Feature Extraction and Selection for Indoor Location Estimation", In Journal of Sensors, vol. 14, Issue 6, Jun. 20, 2014, pp. 11001-11015.

Tarzia, et al., "Indoor Localization without Infrastructure using the Acoustic Background Spectrum", In Proceedings of 9th international conference on Mobile systems, applications, and services, Jun. 28, 2011, pp. 155-168.

Bahl, et al., "RADAR: An In-Building RF-based User Location and Tracking System", In Proceedings of Nineteenth Annual Joint Conference of the IEEE Computer and Communications Societies, Mar. 30, 2000, pp. 775-784.

Farid, et al., "Recent Advances in Wireless Indoor Localization Techniques and System", In Journal of Computer Networks and Communications, Sep. 2013, 12 pages.

Rahok, et al., "Odometry correction with localization based on landmarkless magnetic map for navigation system of indoor mobile robot", In Proceedings of 4th International Conference on Autonomous Robots and Agents, Feb. 10, 2009, pp. 1-6.

Haverinen, et al., "Global indoor self-localization based on the ambient magnetic field", In Journal of Robotics and Autonomous Systems, vol. 57, Issue 10, Oct. 31, 2009.

Vallivaara, et al., "Simultaneous localization and mapping using ambient magnetic field", In Proceedings of IEEE Conference on Multisensor Fusion and Integration for Intelligent Systems, Sep. 5, 2010, pp. 14-19.

Cho, et al., "Map Based Indoor Robot Navigation and Localization Using Laser Range finder", In proceedings of 11th International Conference on Control Automation Robotics & Vision, Dec. 7, 2010, pp. 1559-1564.

Glanzer, et al., "Self-contained Indoor Pedestrian Navigation by Means of Human Motion Analysis and Magnetic Field Mapping", In Proceedings of 7th Workshop on Positioning Navigation and Communication, Mar. 11, 2010, pp. 303-307.

Storms, et al., "Magnetic field navigation in an indoor environment", In Proceedings of Ubiquitous Positioning Indoor Navigation and Location Based Service, Oct. 14, 2010, 10 pages.

Gozick, et al., "Magnetic Maps for Indoor Navigation", In Journal of IEEE Transactions on Instrumentation and Measurement, vol. 60, Issue 12, Dec. 2012, pp. 3883-3891.

Dong, et al., "iMoon: Using Smartphones for Image-based Indoor Navigation Categories and Subject Descriptors", In Proceedings of the 13th ACM Conference on Embedded Networked Sensor Systems, Nov. 1, 2015, pp. 85-97.

Xiao, et al., "Indoor Tracking Using Undirected Graphical Models", In Journal of IEEE Transactions on Mobile Computing, vol. 14, Issue 11, Nov. 1, 2015, pp. 2286-2301.

Shu, et al., "Magicol: Indoor Localization Using Pervasive Magnetic Field and Opportunistic WiFi Sensing", In Journal of IEEE Journal of Selected Areas in Communications, vol. 33, Issue 7, Jul. 2015, pp. 1443-1457.

Brush, et al., "User experiences with activity-based navigation on mobile devices", In Proceedings of the 12th International conference on Human computer interaction with mobile devices and services, Sep. 7, 2010, pp. 73-82.

Riehle, et al., "Indoor Magnetic Navigation for the Blind", In Proceedings of Annual International Conference of the IEEE Engineering in Medicine and Biology Society, Aug. 28, 2012, pp. 1972-1975.

Zheng, et al., "Travi-Navi: Self-deployable Indoor Navigation System", In Proceedings of the 20th annual international conference on Mobile computing and networking, Sep. 7, 2014, pp. 471-482.

Shu, et al., "Last-Mile Navigation Using Smartphones", In Proceedings of the 21st Annual International Conference on Mobile Computing and Networking, Sep. 7, 2015, pp. 512-524.

"International Search Report & Written Opinion Issued in PCT Application No. PCT/CN2016/098316", dated Apr. 28, 2017, 12 Pages.

Duff, Paul Anthony., "Auto-calibrating Ultrasonic Positioning Systems", In thesis submitted to the University of Bristol, UK in accordance with the requirements for the degree of Doctor of Philosophy in the Faculty of Engineering, Department of Computer Science, 2008, 178 Pages.

Fallah, et al., "The User as a Sensor: Navigating Users with Visual Impairments in Indoor Spaces using Tactile Landmarks", In Proceedings of the SIGCHI Conference on Human Factors in Computing Systems, May 5, 2012, 8 Pages.

Pereira, et al. "Open-Source Indoor Navigation System Adapted to Users with Motor Disabilities", In Journal of Procedia Computer Science, vol. 67, Dec. 2015, pp. 38-47.

(56) References Cited

OTHER PUBLICATIONS

Pires, et al., "From Data Acquisition to Data Fusion: A Comprehensive Review and a Roadmap for the Identification of Activities of Daily Living Using Mobile Devices", In Journal of Sensors (Basel), vol. 16, Issue 2, Feb. 2016, pp. 1-27.
"Extended European Search Report Issued in European Patent Application No. 16915444.0", dated Mar. 25, 2020, 8 Pages.

* cited by examiner

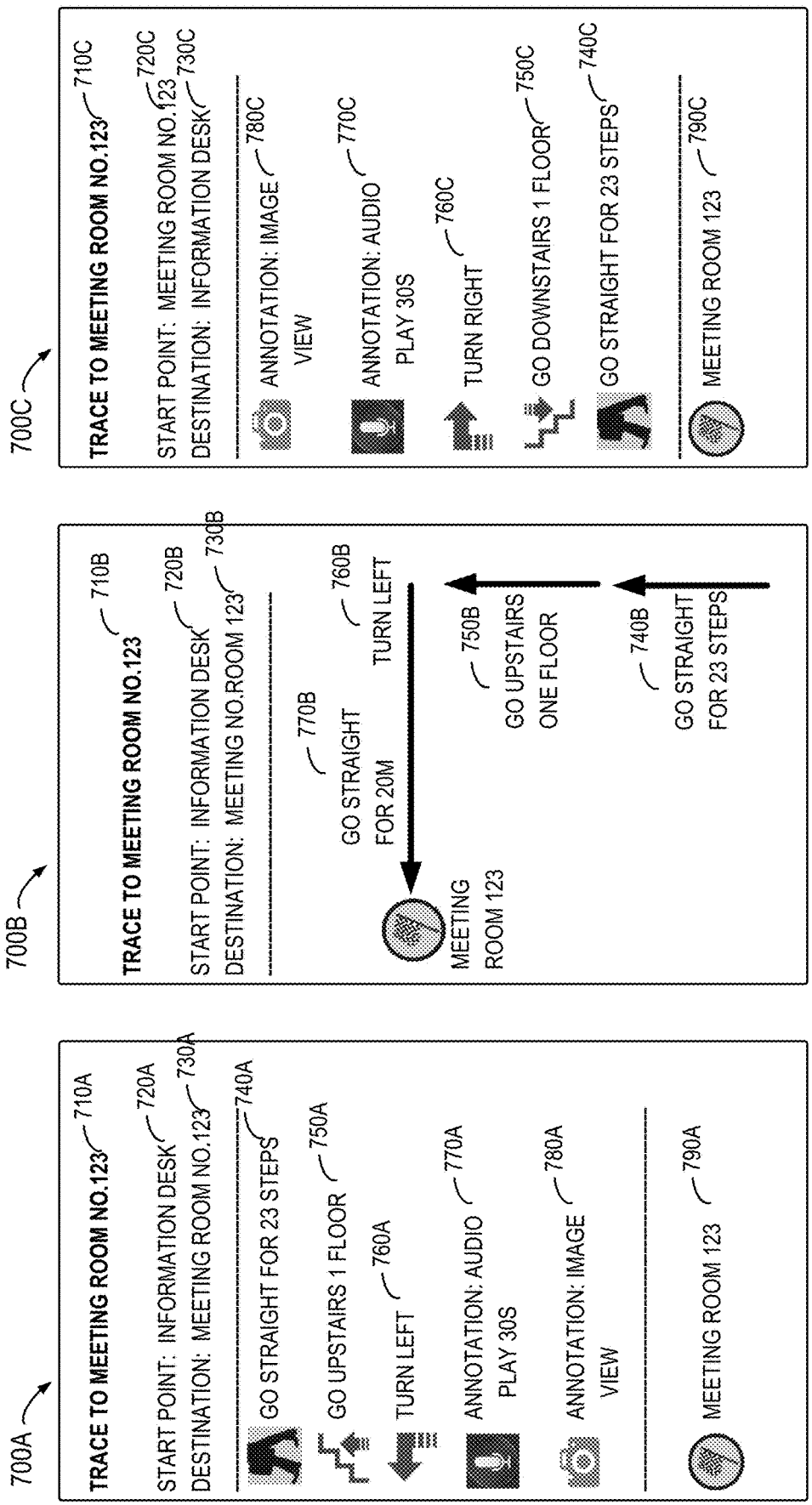

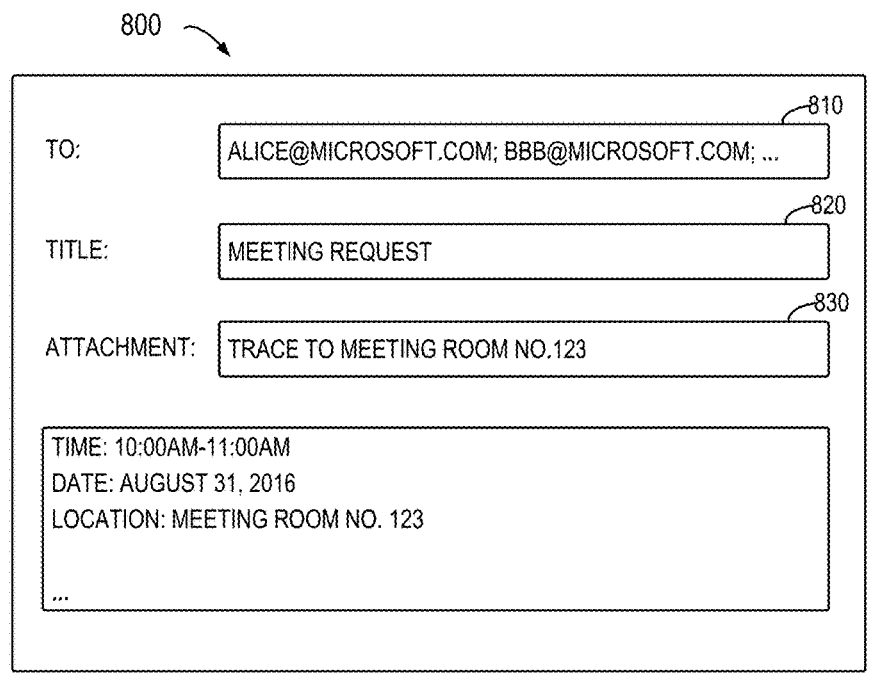
FIG. 8
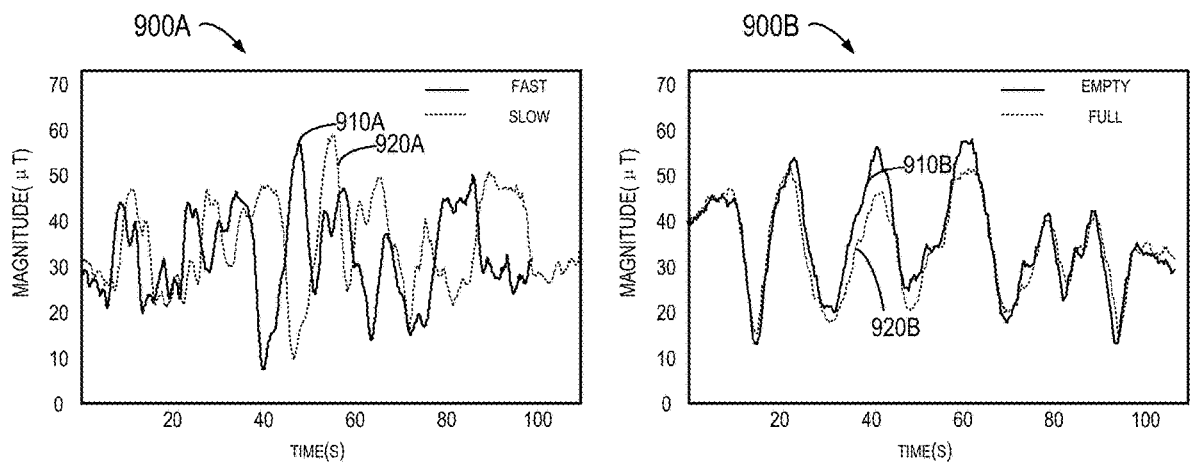
FIG. 9A   FIG. 9B

INDOOR NAVIGATION

BACKGROUND

Navigation applications have been becoming increasingly popular in recent years. A navigation application may be a computer software program installed on a computing device equipped with a Global Positioning System (GPS) module. Based on signals received from GPS satellites and a map (preloaded or downloaded in real time), the navigation application may provide a location of the computing device. Since the signals from the GPS satellites may be attenuated and scattered by roofs, walls and other objects of buildings, generally the navigation application is not suitable to provide indoor navigation.

Several approaches are proposed to build indoor navigation services and most of them try to provide indoor navigation by means of accurate indoor localization. However, these approaches are heavily dependent on map information of the buildings such that the indoor location may be overlaid on the map. In absence of the map information, these approaches become useless.

SUMMARY

In accordance with implementations of the subject matter described herein, a new approach for creating a navigation trace is proposed. Generally speaking, a reference signal is obtained, where the reference signal includes time series data collected by at least one environment sensor along a reference path from a start point to a destination. Then, a navigation trace is created for the reference path based on the obtained reference signal, where magnitudes at locations of the navigation trace reflect measurements collected by the at least one environment sensor at respective time points of the reference signal. In accordance with implementations of the subject matter described herein, a new approach for generating a navigation instruction from a navigation trace is proposed. In these implementations, a navigation trace is obtained, and the navigation trace is represented by reference time series data collected by at least one environment sensor along a reference path from a start point to a destination. Then, measured time series data are collected by at least one sensor moved along a path originated from the start point. Next, a navigation instruction is generated based on the navigation trace and the signal.

It is to be understood that the Summary is not intended to identify key or essential features of implementations of the subject matter described herein, nor is it intended to be used to limit the scope of the subject matter described herein. Other features of the subject matter described herein will become easily comprehensible through the description below.

BRIEF DESCRIPTION OF THE DRAWINGS

The details of one or more implementations of the subject matter described herein are set forth in the accompanying drawings and the description below. Other features, aspects, and advantages of the disclosure will become apparent from the description, the drawings, and the claims, wherein:

FIG. 7A illustrates an example navigation interface for a reference path from a start point to a destination in accordance with an example implementation of the subject matter described herein;

FIG. 7B illustrates another example navigation interface for a reference path from a start point to a destination in accordance with an example implementation of the subject matter described herein;

FIG. 7C illustrates an example navigation interface for a reversed reference path from a destination to a start point in accordance with an example implementation of the subject matter described herein;

FIG. 8 illustrates an example interface for sharing the navigation instructions for a reference path in accordance with an example implementation of the subject matter described herein;

FIG. 9A illustrates an example graph of time series data collected by an environment sensor moved at different speeds in accordance with an example implementation of the subject matter described herein;

FIG. 9B illustrates an example graph of time series data collected at different times of a day by an environment sensor in accordance with an example implementation of the subject matter described herein;

Throughout the figures, same or similar reference numbers will always indicate same or similar elements.

DETAILED DESCRIPTION

Figure 1:
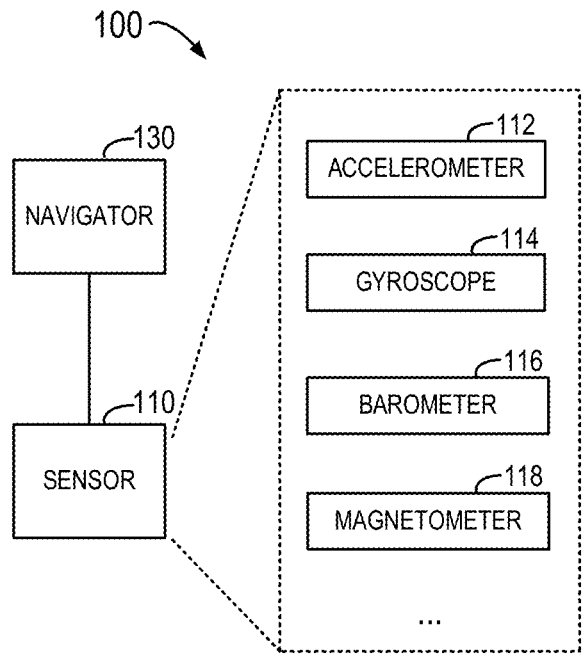
FIG. 1 is a schematic diagram illustrating an architecture in which example implementations of the subject matter described herein may be implemented.

Aspects of the subject matter described herein will now be described with reference to some example implementations. It is to be understood that these implementations are described only for the purpose of illustration and to help those skilled in the art to understand and implement the subject matter described herein, without suggesting any limitations as to the scope of the disclosure. The disclosure described herein can be implemented in various manners other than the ones describe below.

As used herein, the term "include" and its variants are to be read as open terms that mean "include, but is not limited to". The term "based on" is to be read as "based at least in part on". The term "a" is to be read as "one or more" unless otherwise specified. The term "one implementation" and "an implementation" are to be read as "at least one implementation". The term "another implementation" is to be read as "at least one other implementation". Moreover, it is to be understood that in the context of the subject matter described herein, the terms "first", "second" and the like are used to indicate individual elements or components, without suggesting any limitation as to the order of these elements. Further, a first element may or may not be the same as a second element. Other definitions, explicit and implicit, may be included below.

Conventionally, the indoor navigation largely depends on map information, where the map information is used for indicating the exact location of the user. Sometimes, it is hard for a user (for example, a person who is invited to a meeting in an office building) to get the map, then the conventional navigation application may not work at this circumstance.

In order to at least partially solve the above and other potential problems, a new method and device for generating a navigation instruction are provided herein. According to implementations of the subject matter described herein, a reference signal that includes time series data collected by at least one environment sensor along a reference path from a start point to a destination is obtained. For example, the reference signal may be obtained by the environment sensor(s) equipped in a user's mobile device or another movable entity. Then, a movement event is extracted by identifying a pattern from the reference signal, the pattern describing measurements of at least one environment sensor associated with a specific movement. A navigation instruction indicating that the movement event occurs during a movement of the at least one environment sensor along the reference path is generated.

For the purpose of description, the implementations of the subject matter are described in the following scenarios: Bob invites Alice to attend a meeting at the meeting room No. 123 in Building #1. Alice does not know how to go to the meeting room No. 123, and thus Bob will create the navigation instructions leading to the meeting room. As Bob knows the way from the information desk at the gate of the building to the meeting room No. 123, he may "record" a reference path by walking from the information desk to the meeting room, where navigation instructions may be generated for the reference path. After Alice reaches the information desk (for example, with the help of a traditional GPS service), she may follow the generated instructions and go to the meeting room No. 123.

In the context of the present disclosure, Bob who walks along the reference path may be referred to as "a leader," and Alice who follows the navigation instructions for the reference path may be referred to as "a follower." Although the leader and follower described here are human, in other situations, the leader and follower may be any movable entities such as robots or a remote control model car.

In the above mode of leader-follower, Bob may hold his mobile device and walk the reference path, the sensors equipped in his mobile device may collect the measurements related to the environment parameter such as strength the magnetic field along the reference path, and then the collected measurements may be used to generate the navigation instructions. Generally, depending on a type of the environment sensor, measurements of the environment sensor may vary according to the environment state of the sensor. For example, measurements of a magnetometer may be affected by the surrounding objects inside the building, and thus measurements collected at a certain location may reflect features of the certain location. In other words, a magnitude of the measurement may indicate the location of the environment sensor where the measurement is collected. Accordingly, the time series data collected by the environment sensor may reflect the environment state of locations along the reference path, and thereby may be used in positioning and providing the indoor navigation.

Further, measurements of some types of environment sensors may be affected by the action of the leader. For example, the accelerometer in the leader's mobile device may be affected by the leader's walking mode. The curve of the measurements may show a certain pattern when the leader holds the mobile device and walk at low speed, while the curve may show another pattern when the leader runs at a high speed. Accordingly, the measurements collected by the environment sensor may tell what type of actions is performed by the leader along the path.

Considering the above, a new method and device for generating a navigation instruction are provided herein. Based on the time series data collected by the at least one environment sensor, the subject matter may work without knowing the exact location and may provide the navigation instruction in the absence of the map information inside the building. A plurality of environment sensors may be adopted in the subject matter described herein, and details of the environment sensors will be described with reference to FIG. 1 hereinafter.

FIG. 1 is a schematic diagram illustrating an architecture 100 in which example implementations of the subject matter described herein may be implemented. As illustrated in FIG. 1, various types of environment sensors may be used in the subject matter, and the navigator 130 may obtain the measurements from one or more types of the sensors. Specifically, a sensor 110 may include an accelerometer 112, a gyroscope 114, a barometer 116, a magnetometer 118 and the like. From the measurements, the movement event performed by the leader when he/she walks along the reference path may be identified and then a navigation instruction may be generated according to the movement events.

Often, a plurality of sensors, such as the accelerometer, the gyroscope, the barometer and the magnetometer, are provided in common mobile devices such as smartphones, and thus these mobile devices may be used for collecting the environment parameters. In these implementations, the time series data may include one type of environment parameter such as the strength of the magnetic field collected by the magnetometer; alternatively, the time series data may further include another type such as the acceleration collected by the accelerometer. Although details of implementations of the subject matter will be described by using the at least one environment sensor in the mobile device, it is to be understood that the subject matter may be implemented where dedicated environment sensors are equipped on a robot or another movable entity.

Figure 2:
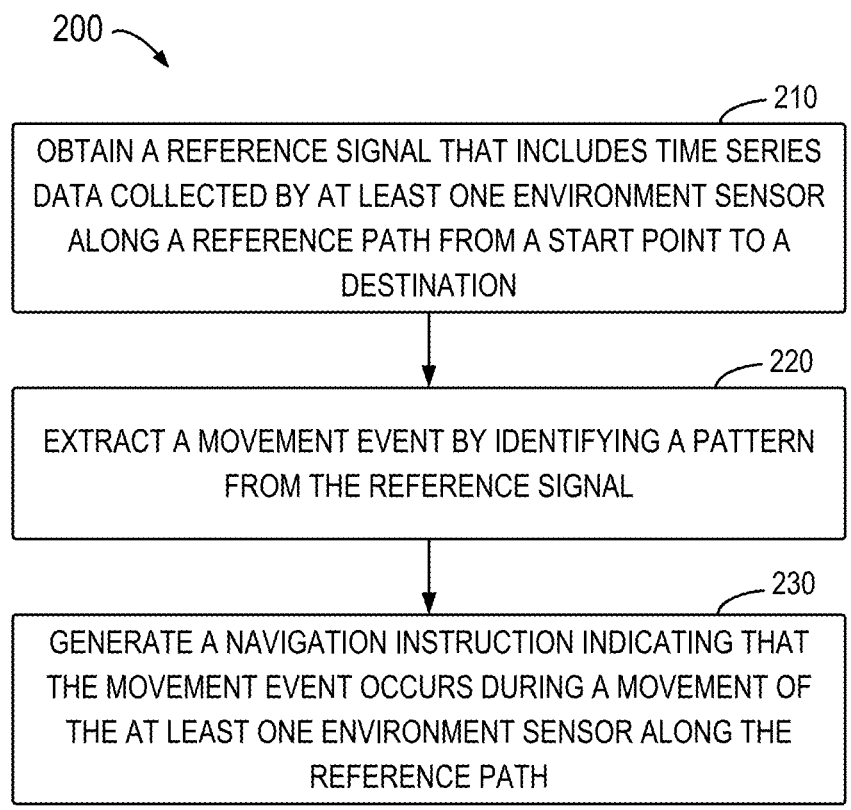
FIG. 2 is a flowchart illustrating a method for generating a navigation instruction in accordance with an example implementation of the subject matter described herein.

FIG. 2 is a flowchart 200 for illustrating a method for generating a navigation instruction in accordance with an example implementation of the subject matter described herein. At 210, a reference signal is obtained, where the reference signal includes time series data collected by at least one environment sensor along a reference path from a start point to a destination. In this step, the time series data may include measurements collected by the at least one environment sensor equipped in the mobile device, and the measurement at each time point of the time series data is the reading of the at least one environment sensor at a location along the reference path.

In one example, where only one sensor is used for collecting the data, then the reference signal may be saved in a data structure of an array with one dimension; if more than one sensors are involved, then the reference signal may be saved in an array with multiple dimensions. Those skilled in the art may adopt various data structures for storing the reference signal as long as the measurement at each time point during the movement of the sensor from the start point to the destination may be saved.

In one implementation, the barometer may be used, while in another implementation, both the accelerometer and the barometer may be used. Various sensors may monitor various aspects of the environment parameters and thus a combination of more than one sensor may provide a higher accuracy in recording the environment parameters, thereby increasing the performance for generating the navigation instruction.

At 220, a movement event is extracted by identifying a pattern from the reference signal, where the pattern describes measurements of at least one environment sensor associated with a specific movement. Several actions may be performed by the leader during the travel along the reference path. For example, Bob may hold the mobile device and slowly walk along the reference path. In this situation, each of the stepping actions may be taken as a movement event. Additionally, further actions such as turning left/right, going upstairs/downstairs may also be considered as movement events.

When the sensor is subject to the movement event, the curve of the measurements of the sensor during the movement event may show a certain pattern. If a barometer is used for collecting the atmospheric pressure, then the curve of the measurement may show a sharp rise when the leader carries the mobile device and goes upstairs by an elevator; and the curve of the measurement may show a sharp fall when the leader goes downstairs.

The pattern may be predefined according to historical measurements of the environment sensor during the specific movement. In one implementation, one pattern may be defined with respect to each event (such as an up/down event, a stepping event and a turning event). In one implementation, the movement may be repeated several times so as to obtain a pattern that may reflect the average measurements during the movement. Alternatively, or in addition, in one implementation, multiple models of the sensors may be used in multiple experiments to obtain the pattern. Alternatively, or in addition, in one implementation, the pattern may be specific to a certain building. In one example, the floor heights of different buildings may vary, and thus a dedicated pattern may be defined for a certain building. In a particular example, one pattern may be predefined for the up event associated with a floor height of 3 meters, and another pattern may be predefined for the up event associated with a floor height of 4.5 meters.

At 230, a navigation instruction is generated to indicate that the movement event occurs during a movement of the at least one environment sensor along the reference path. As the movement event extracted at 220 indicates what type of movement occurs along the reference path, a related navigation instruction may be generated and then displayed. In one implementation, the leader holds the mobile device and walks along the reference path, and the multiple sensors in the mobile device may collect the time series data during the walk. By comparing the collected time series data with a predefined pattern, a movement event may be extracted and then a navigation instruction may be generated. In one implementation, the navigation instruction may be generated on the fly during the leader's walk: if the leader walks ahead, then one stepping event may be determined from each step; and if the leader turns left, then one turning left event may be detected during his/her turning. In another implementation, the navigation instruction may be generated after the walk and the generating step may be triggered by the leader or in an automatic manner.

According to implementations of the subject matter described herein, a geographical range along the reference path may be obtained based on the identified pattern, where the geographical range is defined by locations of the at least one environment sensor during the movement along the reference path. Then, the navigation instruction may be generated to indicate that the movement event occurs within the geographical range.

As the movement event is taken within a specific range along the reference path, the geographical place of the range is needed so as to clearly indicate where the movement event occurs. In the above example, the start point (the information desk) of the reference path is known, and a list of movement events taken along the reference path may be determined according to the above method. Based on the start point and the movement events, the range associated with each movement event may be cumulatively obtained. In one example, when the leader walks straight, a first stepping event may be determined from the first step, a second stepping event may be determined from the second step, and so on. For an average person, if the average length of an ordinary step is 70 centimeters, based on a previous geographical range of a previous movement event, the current geographical range where the current movement event occurs may be determined cumulatively.

In one implementation, the rule for determining the geographical range associated with the movement event may be set according to the profile of the leader. If the leader is a man, then the step length may be for example 70 centimeters; if the leader is a woman, then the step length may be set to 60 centimeters.

According to implementations of the subject matter described herein, multiple environment sensors may be used for collecting various aspects of the environment data. Details related to the multiple environment sensor adopted in the implementations of the subject matter will be described with reference to FIGS. 3 to 5.

According to implementations of the subject matter described herein, the at least one environment sensor may comprise an accelerometer, the reference signal may comprise an acceleration signal collected by the accelerometer, and the pattern may describe measurements of the accelerometer associated with a stepping event. In these implementations, the navigation instruction may indicate that a stepping event occurs within the geographical range.

The accelerometer is a dedicated sensor for measuring accelerations in various directions. During the movement along the reference path, the accelerometer with 3-axis sensing ability may monitor accelerations in three directions. Then, the accelerations in the three directions may vary during the movement and thus the time series data during the leader's walk may be obtained. For simplicity, steps for processing the acceleration in one dimension are described with reference to FIG. 3.

Figure 3:
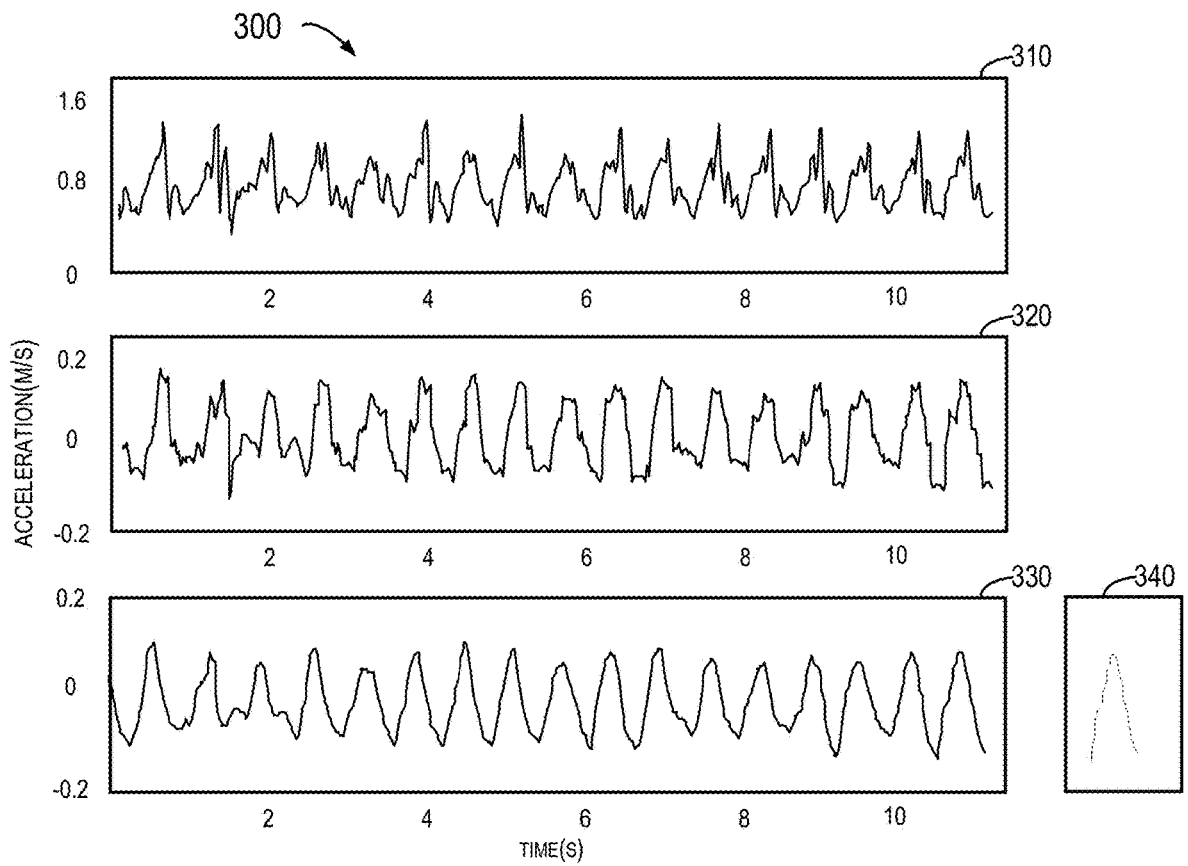
FIG. 3 illustrates an example graph including various steps for processing time series data collected by an accelerometer along a reference path from a start point to a destination in accordance with an example implementation of the subject matter described herein.

FIG. 3 illustrates an example graph including various steps for processing example time series data collected by an accelerometer along a reference path from a start point to a destination in accordance with an example implementation of the subject matter described herein. After the data collection, optimizations may be applied to the raw time series data. In FIG. 3, the graph 310 illustrates a raw signal collected by the accelerometer, where the raw signal includes some noise point that may cause abnormalities in the further processing. Accordingly, the raw signal may be cleaned and filtered to remove the abnormal measurements based on the technical solutions in the field of digital signal processing. For example, a low-pass filter may be used to remove the high-frequency noises, and then the raw signal is converted into a cleaned signal as illustrated in the graph 320. Next, the cleaned signal may go through further adjustments to smooth the measurements and minimize the effects of sensor drifting. Then, the smoothed signal may be normalized into the shape as illustrated in the graph 330.

In order to extract the movement event, the normalized signal may be compared with the predefined pattern (for example, the pattern 340 as illustrated in FIG. 3), if a match is found in the graph 330, it indicates that a stepping event is taken along the reference path. In the graph 330, multiple matches are detected, and each match corresponds to a stepping event. At this point, the navigation instruction associated with the multiple stepping events may be collectedly referred to as "go straight for 17 steps."

The above paragraphs describes the actions for processing the raw signal by taking the acceleration signal collected by the accelerometer as an example, other raw signals collected by other types of environment sensors may be subject to similar processing. Those skilled in the art may work out the details of the processing based on the types of the sensor as well as other related requirements.

According to implementations of the subject matter described herein, the at least one environment sensor may comprise a barometer, the reference signal may comprise a barometric pressure signal collected by the barometer, and the pattern may describe measurements of the barometer associated with an up/down event. In these implementations, the navigation instruction may indicate that an up/down event occurs within the geographical range.

A barometer is a dedicated sensor for measuring atmospheric pressure. During the movement along the reference path, the barometer may monitor changes in the atmospheric pressure on the way. The collected barometric pressure signal may go through the processing steps as illustrated in FIG. 3, then the normalized barometric pressure signal may be compared with a predefined pattern for the up/down event. Usually, multiple manners of going up/down are provided inside a building, where the leader may go up/down by staircase climbing, by an elevator or an escalator. Accordingly, the up/down event may be sub-divided into three types: a stair up/down, an elevator up/down and an escalator up/down.

Figure 4:
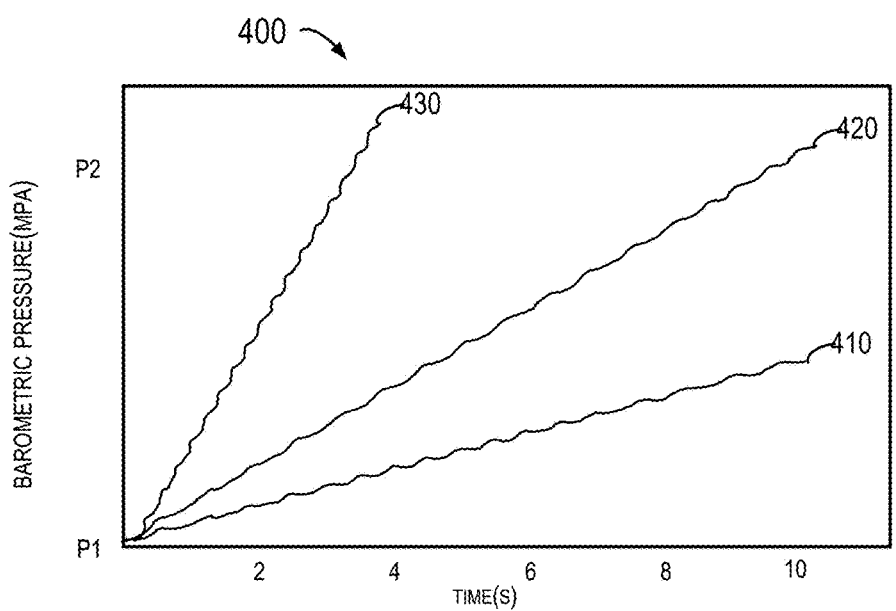
FIG. 4 illustrates an example graph including time series data collected by a barometer in accordance with an example implementation of the subject matter described herein.

FIG. 4 illustrates an example graph including time series data collected by a barometer in accordance with an example implementation of the subject matter described herein. In FIG. 4, the horizontal axis indicates the time and the vertical axis indicates the barometric pressure. The curve 410 represents measurements collected by the barometer when the leader goes down the stairs to reach a lower level in the building. As the speed of staircase walk is relative slow, the slope of the curve 410 is small. The curve 430 represents measurements collected by the barometer when the leader takes an elevator to reach a lower level, and the slope of the curve 430 is great due to the high speed of the elevator. Further, the curve 420 represents measurements collected by the barometer when the leader takes an escalator to reach a lower level, and then the slope of the curve 430 is medium.

Three patterns may be predefined for the stair up/down event, the elevator up/down event and the escalator up/down events. By comparing the atmospheric pressure signal as collected by the barometer and the predefined patterns, the movement events that occur along the reference path may be identified. Although FIG. 4 illustrates an example of the sub-divisions of a down event, those skilled in the art may work out the detailed steps for extracting an up event, and details of the up event are omitted hereinafter.

According to implementations of the subject matter described herein, the at least one environment sensor may comprise a gyroscope, the reference may signal comprise an orientation signal collected by the gyroscope, and the pattern may describe measurements of the gyroscope associated with a turning event. In these implementations, the navigation instruction may indicate that a turning event occurs within the geographical range.

Figure 5:
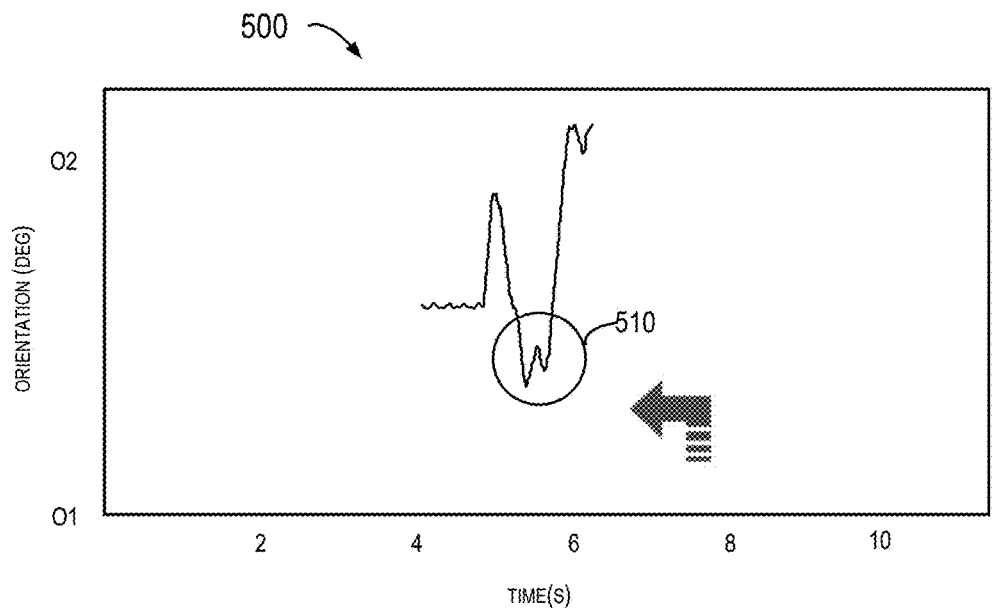
FIG. 5 illustrates an example graph including time series data collected by an gyroscope in accordance with an example implementation of the subject matter described herein.

The gyroscope is a sensor that measures the angular velocity. By using the gyroscope measurements, the relative rotation angular may be obtained in each direction. Combined with the accelerometer, the gyroscope, the multiple sensors may be used to infer the orientation of the mobile device. In these implementations, the collected orientation signal may be cleaned, smoothed and normalized into a curve as illustrated in FIG. 5. In FIG. 5, the highlighted portion 510 may be matched to a predefined pattern corresponding to a left turning event. At this point, a navigation instruction associated with a left turning event may be generated. Similarly, the patterns corresponding to a right turning event and a U-turn event may be predefined in advance, and these patterns may be used in extracting a turning event from the reference signal.

According to implementations of the subject matter described herein, optimizations may be performed across different sensors. For example, sampling rate normalization may be conducted. In one example, one uniformed sampling rate may be adopted across the above sensors. Specifically, a constant sampling rate of 40 Hz or another sampling rate may be selected. Further, the sample value of the nearest-neighbor from the current timestamp may be used to handle missing values of a specific sensor. By this way, measurements from the multiple sensors may be synchronized and combined for extracting the movement event.

According to implementations of the subject matter described herein, an annotation associated with the movement event may be generated, where the annotation may be selected from a group consisting of a comment, an image, a video, an audio, and metadata. Implementations allow the system to generate an annotation associated the movement event, and the annotation may relate to landmarks and points of interest along the reference path.

In one implementation, an image may be taken at a location where the movement event is taken. Continuing the above example, when the leader walks along the reference path from the information desk to the meeting room No. 123, he may take a photo at the corner of the corridor. Further the leader may input some comments to describe the movement event. The comments such as "turn left at the end of the corridor" may be generated and inserted as a new navigation instruction or attached to an existing one. In another implementation, video and audio fragments are allowed to be generated. The leader may use the camera and microphone equipped in the mobile device to record video/audio fragments. The video fragment may relate to the leader's views when he walks along the reference path. For example, the video may be about the corridor go by, the nameplate on the office door, and the like. The audio fragment may be the leader's voice instructions of how to reach the destination. Further, metadata such as the length of the step may be added by the leader, so as to provide more accurate navigation instructions.

In one implementation, images of the start point and the destination may be generated and added into the navigation instruction to provide a vivid appearance of the reference path. In the above example, the leader may take a photo of the start point and indicate that the reference path starts here. In addition, the leader may take a photo of the meeting room No. 123 to provide the appearance of the destination.

A plurality of movement events may be taken along the reference path. In this way, a portion or all of these movements may be extracted so as to generate corresponding navigation instructions. According to implementations of the subject matter described herein, a second movement event may be extracted by identifying a second pattern from the reference signal, where the pattern may describe measurements of at least one environment sensor associated with a second movement. Then, a second navigation instruction may be generated to indicate that the second movement event occurs during the movement of the at least one environment sensor along the reference path. Next, an instruction list including the navigation instruction and the second navigation instruction may be created.

In these implementations, sequential movement events may be extracted from the reference signal collected along the reference path. As a result, presented with an instruction list comprising the sequential movement events, the follower may reach the destination from the start point in a convenient manner. The navigation instructions included in the instruction list record the movement events that occur along the reference path. As each movement event is associated with a certain location along the reference path, the movement event and the location may clearly define how to reach the destination from the start point. In the above example, the instruction list may be generated from the time series data collected by the environment sensors equipped in the leader's mobile device. Then, the instruction list may be shared to the follower. With the instruction list, Alice may follow the instructions in the list when she arrives at the information desk at the gate of the building.

According to implementations of the subject matter described herein, the navigation instruction and the second navigation instruction included in the instruction list may be reversed to provide the navigation along a reversed path from the destination to the start point. In the navigation list for the reference path (from the start point to the destination), the movement events are arranged in a chronological order. By a reversing procedure, another navigation list for a reversed path from the destination to the start point may be created based on this list without taking the mobile device to record the environment parameters along the reversed path.

In these implementations, the original instruction list for the reference path may be subject to the following reversing procedure so as to create a reversed list. That is, the movement events in the original list may be re-arranged according to a reversed time order. In other words, the first event in the original list becomes the last one, and the last event becomes the first. Moreover, some types of the movement events in the original list may be mapped into a reversed event. For example, the left turning event may be mapped into the right turning event, and the up event may be mapped into the down event, and so on.

In this reversing procedure, the stepping event may remain unchanged. By processing the original list with the above reversing procedure, a reversed list may be created without the need of walking along the reversed path. The reversed path may be helpful in many situations, especially when the leader walks along a reference path and wants to get back to the start point. For example, Bob parks his car in an underground parking lot and then goes to visit a client on the tenth floor. He may record a path from the location of his car to the office of the client. When Bob comes back, he may reverse the path and follows the instructions to reach his car. At this point, the leader and the follower are the same person.

Figure 6A:
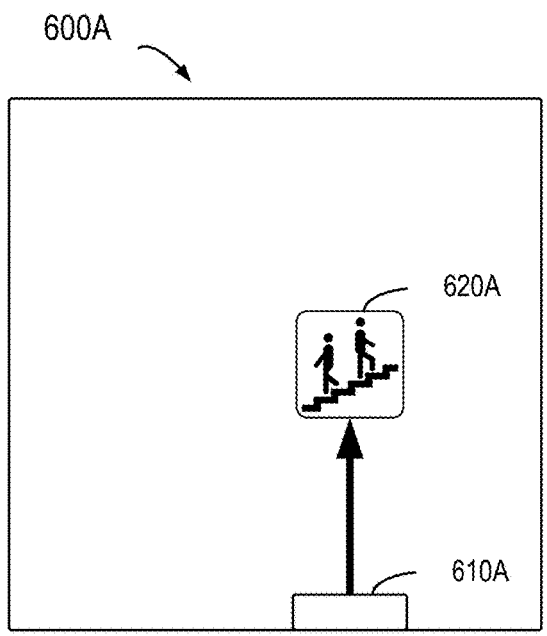
FIG. 6A illustrates a map related to a first portion of a reference path from an information desk to a meeting room in the first floor in accordance with an example implementation of the subject matter described herein.
Figure 6B:
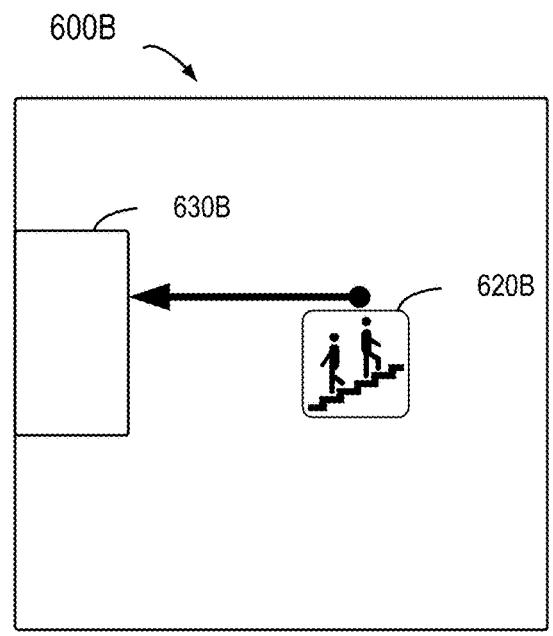
FIG. 6B illustrates a map related to a second portion of the reference path in the second in accordance with an example implementation of the subject matter described herein.

The following paragraphs will describe how to generate a navigation list for a reference path from the information desk to the meeting room No. 123 with reference to FIGS. 6A, 6B, 7A, and 7B. FIG. 6A illustrates a map 600A related to a first portion of a reference path from the information desk to the meeting room in accordance with an example implementation of the subject matter described herein, where the map 600A is a schematic map of the first floor of a building. FIG. 6B illustrates a map related to a second portion of the reference path in accordance with an example implementation of the subject matter described herein, where the map 600B is a schematic map of the second floor of the building.

In FIG. 6A, the information desk 610A is located at the gate of the building. In order to reach the meeting room No. 123 (illustrated as 630B in FIG. 6B), the leader should go straight to the stairs 620A in the first floor, go upstairs to the stairs 620B on the second floor, turn right and then go straight to reach the meeting room 630B. In order to create an instruction list from the information desk 610A in FIG. 6A to the meeting room 630B in FIG. 6B, the leader should take the following actions after the departure from the information desk 610A: (1) go straight to the stairs 620A, (2) go upstairs to the stairs 620B, (3) turn left at the stairs 620B, and (4) go straight to the meeting room 630B.

By using the implementations described in the preceding paragraphs, the time series data may be collected by the environment sensors in the leader's mobile device, and then the collected time series data may be compared with the predefined patterns to extract various movement events. Specifically, movement events corresponding to the above actions (1) to (4) may be obtained from the time series data and navigation instructions for these movement events may be generated to create the instruction list. Further, the leader may add some annotations into the navigation instructions. For example, the leader may record an audio fragment and inform the follower to go straight for 20 meters at the stairs of the second floor. For another, the leader may take a photo of the meeting room No. 123 and add it into the instruction list.

According to implementations of the subject matter described herein, navigation instructions in the list may be displayed. Reference will be made to FIGS. 7A to 7C to describe details of displaying the navigation instructions. FIG. 7A illustrates an example navigation interface for a reference path from a start point to a destination in accordance with an example implementation of the subject matter described herein. The interface illustrates navigation instructions along the reference path from the information desk to the meeting room. In FIG. 7A, the reference number 710A indicates a name of the instruction list, where start point 720A indicates that the reference path is from the information desk, and the destination 730A indicates that the reference path ends at the meeting room No. 123. The area in the middle of the interface shows navigation instructions 740A to 790A along the reference path.

The navigation instruction 740A indicates that the leader walks 23 steps after leaving the information desk. The navigation instruction 750A indicates that a stair up event occurs immediately after the 23 steps. Next, the navigation instruction 760A indicates that a left turn event occurs immediately after the stair up event. In this example, as the leader records the audio fragment (for example, with a length of 30 seconds), a button (as illustrated by 770A) may be displayed on the screen for playing the audio file. In one implementation, if automatic speech recognition is adopted, the audio file may be converted into text and displayed on the screen.

In addition, depending on the time series data from the sensor and the content of the audio file, a further movement event may be extracted. For example, if the time series data indicates 30 stepping events and the audio file says "I reach the second floor, and the meeting room is about 20 meters ahead." Then both of the extracted movement event and the annotation confirm that the leader walks straight for about 30 meters. Further, the annotation 780A may be an image of the meeting room 790A, which shows the end of the navigation.

It is to be understood that the interface as illustrated in FIG. 7A is only an example for the instruction list, and modifications may be made to the interface. In one implementation, the navigation instructions associated with the extracted movement events and the annotations may be displayed in different styles. The movement event may be displayed in a first level in bold, and the annotations may be displayed in a second level with a small font size.

In another implementation, a schematic diagram may be used for displaying the instruction list. FIG. 7B illustrates another example navigation interface for a reference path from a start point to a destination in accordance with an example implementation of the subject matter described herein. In FIG. 7B, reference numbers 710B to 770B correspond to the counterparts as illustrated in FIG. 7A and details may be omitted hereinafter. Different from the interface with icons and texts, FIG. 7B displays each navigation instruction by a schematic diagram. The arrows indicate heading directions associated with the movement events. Taking the navigation instruction 740B as an example, the arrow indicates stepping events occur along the reference path. The navigation instruction 750B indicates going upstairs and the navigation instructions 760B and 770B indicate turning left and going straight respectively.

In addition to displaying the original instruction list, another instruction list for the reversed path may be displayed. Referring to FIG. 7C, an example navigation interface for a reversed reference path from a destination to a start point is illustrated. In FIG. 7C, the instruction list is created based on the original instruction list and the navigation instructions 740C to 790C are displayed in a reversed order. Those skilled in the art may work out the detailed implementations based on the principle as described in the preceding paragraphs, and the details are omitted hereinafter. The interface shows the reversed path from the meeting room to the information desk. In the above example, after the meeting, Alice may use the reversed list to go back to the information desk from the meeting room.

According to implementations of the subject matter described herein, the instruction list may be shared to one or more followers. FIG. 8 illustrates an example interface for sharing navigation instructions for a reference path in accordance with an example implementation of the subject matter described herein, where the interface illustrates the window of the email client. Continuing the above example, Bob walks along the reference path and generates the instruction list for reaching the meeting room No. 123 from the information desk. After that, he may attach the instruction list to the meeting request and share it among the invitees. As illustrated in FIG. 8, email addresses of the invitees may be added into the field 810, and the instruction list may be enclosed as an attachment 830 of the meeting request 820. Upon receipt of the meeting request, Alice may load the attached instruction list into her mobile device and start the indoor navigation when she reaches the information desk of the building. After the meeting, Alice may create a reversed instruction list to lead her from the meeting room back to the information desk.

The above paragraphs describe example implementations of sharing the instruction list among a group of persons by email as an example, in another implementation, the instruction list may be shared to the public, for example via a social network, or via a website of the building. This implementation may be especially helpful for public services. In one example, a famous painting may be exhibited in a certain exhibition room of a public museum. For a big museum, it is not easy for the visitors to directly reach the exhibition room from the gate of the museum. In order to provide a quick access to the famous painting, an instruction list for a reference path from the gate to the exhibition room of the museum may be created in advance and published on the office website of the museum. At this point, the visitors may download the instruction list and go the exhibition room accordingly.

According to implementations of the subject matter described herein, the at least one environment sensor is deployed on a movable entity, and measurements may be collected by the at least one environment sensor at a predefined interval during a movement of the entity along the reference path to form the reference signal.

In the implementations described in the preceding paragraphs, the measurements are collected by the environment sensors equipped in the mobile device and the mobile device is carried by a person walks along the reference path. In other situations, the at least one environment sensor may be deployed on a movable entity such as a robot, or a remote control model car, as long as the movable entity may travel along the reference path.

In one implementation, a common mobile device may be deployed to the movable entity, in another implementation, the at least one sensor may be directly equipped in the movable entity. For example, in the situation of Searching and Rescuing (SAR), the at least one sensor may be equipped on an SAR robot, and then the robot may enter into areas not suitable for human access. As the entity may be driven by the motor engine, the predefined pattern may be different from that used in the situation of detecting human movement events. Those skilled in the art may define the shape of the pattern according to historical measurements, such as the measurements collected by the sensor equipped on a same type of movable entity. In an example of a professional SAR robot, operation states of the engine may be monitored and these states may be considered together with the measurements by the sensor in extracting the movement event and generating the navigation instruction.

According to implementations of the subject matter described herein, the navigation instruction may be propounded without a map of the reference path. Unlike the traditional navigation applications, the implementations may work without a map of the related area. In most cases, the building may be a private area and it is hard for a visitor to get the map inside the building. Even if the visitor may obtain the map, the traditional navigation application cannot provide accurate location information without the assist of GPS satellite. However, the implementations of the subject matter depend on the environment parameters collected by the sensor along the reference path and thus may provide navigation services without the requirement of determining the accurate physical locations within the building.

According to implementations of the subject matter described herein, a human readable summary may be created for the instruction list. A human readable summary may be created based on the extracted movement events to give a brief description of the reference path. In one implementation, the readable summary may include the start point, the destination, the time duration of the travel and the like. In another implementation, other data may be added to the readable summary such as photos and/or videos along the reference path so as to provide more visual views in leading the follower to the right destination.

The preceding paragraphs describe how to generate navigation instructions for a reference path from the start point to the destination. The navigation instructions may be provided to the follower and lead him/her to travel along the reference path. In one example, Bob holds his mobile device and walk along the reference path from the information desk to the meeting room No. 123. Navigation instructions may be generated for the reference path. Then Alice may use the navigation instructions shared by Bob to lead her to the meeting room. For some reason, during Alice's walk, even if the navigation instructions are displayed to her, there might be possibility that she may not exactly follow the instructions and may deviate from the reference path.

At this point, if an error occurs during the execution of a certain instruction, Alice may reach a wrong location. Thereby she may be led to a wrong direction even if she exactly follows all the navigation instructions subsequent to the certain instruction, because Alice starts at a wrong location which may be not along the reference path. Considering the above situation, it is desired to generate a location based navigation instruction to ensure that the navigation instruction may be executed at a correct location.

It is known that the measurements collected by the sensor are influenced by the surrounding of the location of the sensor, although the reading of the sensor at a certain location may vary at different times, usually the difference among the readings is within a certain threshold. FIG. 9A illustrates an example graph of time series data collected by an environment sensor (such as a magnetometer) moved at different speeds in accordance with an example implementation of the subject matter described herein. In FIG. 9A, the horizontal axis indicates the time and the vertical axis indicates the strength of the geomagnetic field. The two curves 910A and 920A represent two time series data collected along a reference path when the mobile device moves at different speeds. The curve 910A illustrated with solid line represents the signal collected by holding the mobile device and walking along the reference path at a high speed, and the curve 920A illustrated with dotted line represents the signal collected by holding the mobile device and walking along the reference path at a low speed. By comparing the curves 910A and 920A, although the time durations of the two curves are different, the shapes of the two curves are similar. If the curve 920A is compressed to the same time duration as that of the curve 910A, the compressed curve and the curve 910A may be roughly aligned.

FIG. 9A illustrates the time series data in an environment where the surroundings are the same. In some cases, for example in an underground parking lot, the surroundings may change thereby the measurements collected by the sensor may vary accordingly. FIG. 9B illustrates an example graph of time series data collected at different times of a day by an environment sensor in accordance with an example implementation of the subject matter described herein. In FIG. 9B, the curve 910B illustrated with solid line represents the signal collected in an empty parking lot (for example, during the night time), and the curve 920B illustrated with dotted line represents the signal collected in a parking lot full of cars. By comparing the curves 910B and 920B, although the magnitudes of the two curves 910A and 910B are slightly different, the peaks and valleys of the two curves 910A and 910B have a corresponding relationship.

From FIGS. 9A and 9B, although the curves of the time series data associated with different moving speeds and surroundings are not exactly the same, these curves collected along a same reference path follow a similar shape and thus the magnitudes in the time series data may be used as indicators for the locations of the sensor long the reference path.

In view of the above, a new method and device for creating a navigation trace are provided herein to at least partially solve the above and other potential problems. According to implementations of the subject matter described herein, a reference signal is obtained, where the reference signal includes time series data collected by at least one environment sensor along a reference path from a start point to a destination. Next, a navigation trace is created for the reference path based on the obtained reference signal, where magnitudes at locations of the navigation trace reflect measurements collected by the at least one environment sensor at respective time points of the reference signal.

Figure 10:
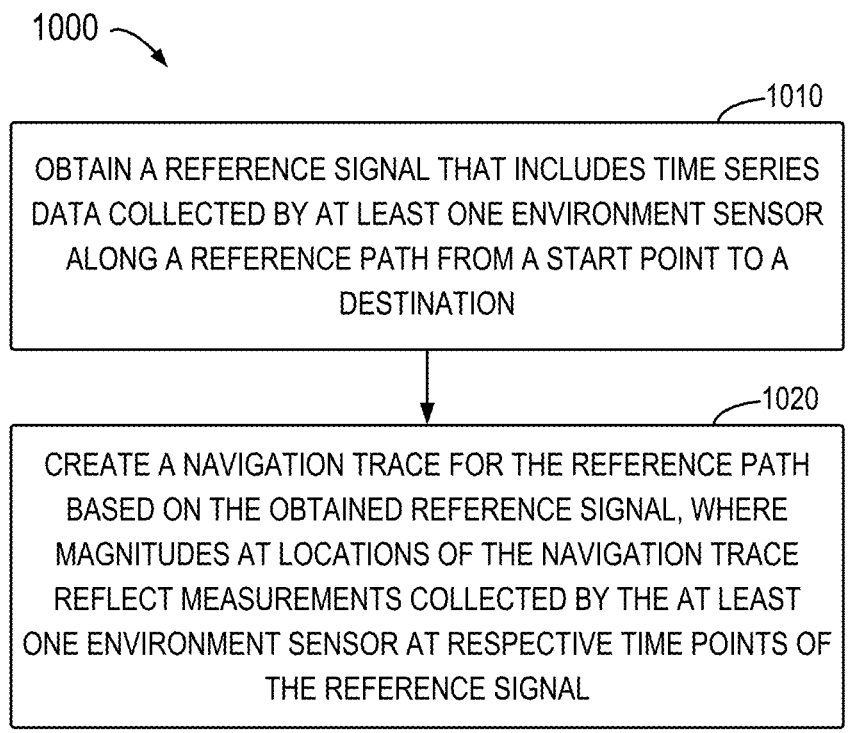
FIG. 10 is a flowchart illustrating a method for generating a navigation trace in accordance with an example implementation of the subject matter described herein.

FIG. 10 is a flowchart 1000 illustrating a method for generating a navigation trace in accordance with an example implementation of the subject matter described herein. At 1010, a reference signal including time series data is obtained, where the time series data is collected by at least one environment sensor along a reference path from a start point to a destination. In this step, the time series data may include measurements collected by the at least one environment sensor, for example, the sensor(s) equipped in the mobile device.

The collected measurements by the sensor may change according to the locations of the sensor. In one implementation, the magnetometer may measure the strength and direction of the geomagnetic field at the location of the magnetometer. Due to the location sensitivity feature, the ubiquitousness and stability of the geomagnetic field, the magnetometer may be a candidate sensor that may be used in the implementations. Further, other types of sensors may be adopted according to the specific indoor environment of the building. In this step, more than one environment sensor may be used in collecting the time series data. Various sensors may monitor various aspects of the environment parameters and thus a combination of more sensors may provide a higher accuracy in creating the navigation trace.

At 1020, a navigation trace is created for the reference path based on the obtained reference signal, where magnitudes at locations of the navigation trace reflect measurements collected by the at least one environment sensor at respective time points of the reference signal. As the magnitude at a certain location in the navigation trace reflects the measurement at a time point of the reference signal, the magnitude may indicate the location of the environment sensor in some ways.

According to implementations of the subject matter described herein, the at least one environment sensor is deployed on a movable entity, where the measurements may be obtained by the at least one environment sensor at a predefined interval during a movement of the entity along the reference path to form the reference signal. As described in the preceding paragraphs, the movable entity may be a person, a robot, a remote control model car or another entity that may travel along the reference path from the start point to the destination. In this implementation, multiple types of movable entities may be selected for carrying the at least one sensor.

Figure 11:
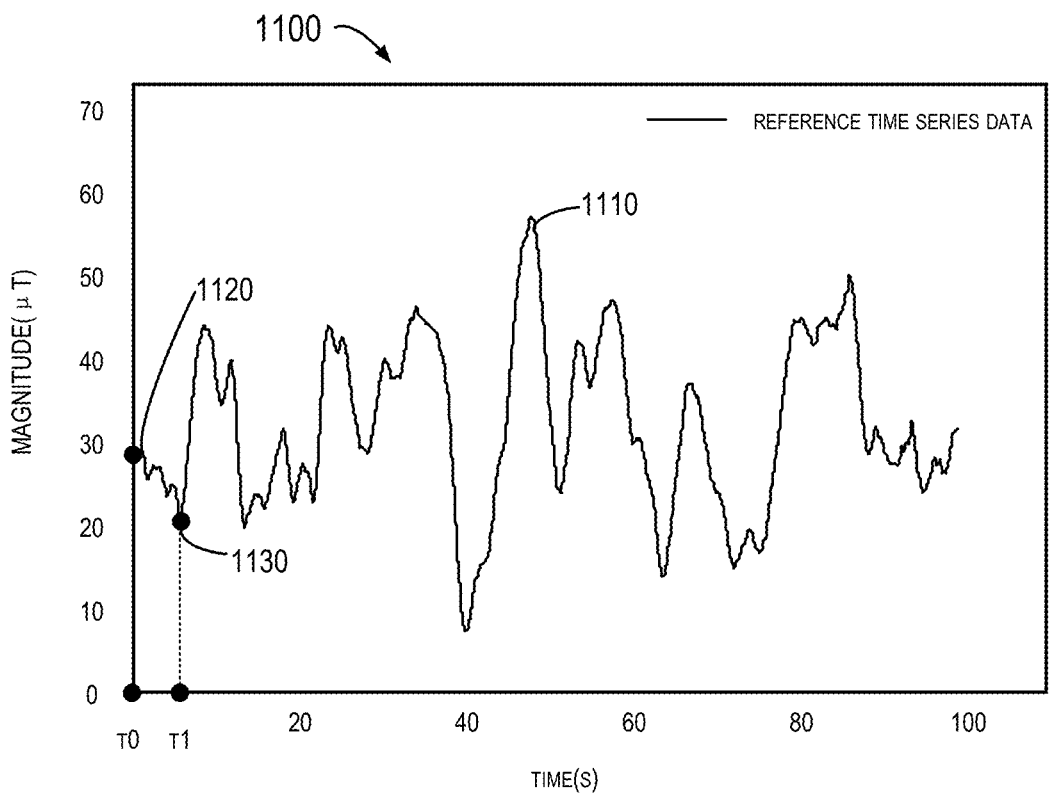
FIG. 11 illustrates reference time series data collected by a magnetometer along a reference path from an information desk to a meeting room in accordance with an example implementation of the subject matter described herein.

According to implementations of the subject matter described herein, during creation of the navigation trace, each time point of the reference signal may correspond to a location along the reference path. Specifically, for a time point of the reference signal, a measurement at the time point of the reference signal may be associated with a location at which the at least one environment sensor is located at the time point to generate a magnitude at the location. Reference will be made to FIG. 11 to describe the procedure for creating the navigation trace.

FIG. 11 illustrates a graph of reference time series data collected by a magnetometer along a reference path from an information desk to a meeting room in accordance with an example implementation of the subject matter described herein. In FIG. 11, the curve 1110 indicates the reference time series data and the magnitudes 1120 and 1130 are two sample points in the curve 1110. The magnitude 1120 represents a measurement collected by the magnetometer at a first time point T0, where the time point T0 corresponds to the start point in the reference path. As illustrated in FIG. 11, the magnitude 1120 may be associated with the start point in the reference path, because the sensor is located at the start point at the time point of T0.

The time point T1 is the sampling immediately after the time point T1. In FIG. 11, the distance between the two successive sampling time points T0 and T1 is associated with the sampling rate of the sensor, and the scale of the distance between time points T0 and T1 is enlarged for clarity. In the implementations, the time difference may be determined by the sampling rate of the sensor, for example, the time difference may be 0.025 second for a rate of 40 Hz. The magnitude 1130 represents a measurement collected by the magnetometer at a second time point T1, where the time point T1 corresponds to a next location nearby the start point. As illustrated in FIG. 11, the magnitude 1130 may be associated with the next location, because the sensor is located at the next location at the time point of T1.

In these implementations, the distance between two successive locations along the reference path depends on the moving speed of the sensor and the sampling rate of the sensor. According to the procedure as described with reference to FIG. 11, the magnitude at each point of the navigation trace is associated with a location along the reference path, and thereby the magnitude may be an indicator of the location along the reference path.

With the method described above, the navigation trace may be created for the reference path. Further, based on a similar principle for creating the navigation along a reversed path from the destination to the start point, the navigation trace may be reversed and then a reversed trace may be created for the reversed path. According to implementations of the subject matter described herein, the navigation trace may be reversed to provide the navigation along a reversed path from the destination to the start point.

In these implementations, the original navigation trace for the reference path may be subject to a reversing procedure, so as to create a reversed trace: the magnitudes in the original trace may be re-arranged according to a reversed time order. By processing the original trace with the above reversing procedure, a reversed trace may be created without the need of walking along the reversed path. The reversed trace may be helpful in many situations, especially when the leader walks along a reference path and wants to get back to the start point.

According to implementations of the subject matter described herein, the navigation trace may be shared to a certain person, among a group of person, or to the public. The implementations for sharing procedure may be similar to what is described with reference to FIG. 8 in the preceding paragraphs and details are omitted hereinafter.

According to implementations of the subject matter described herein, the at least one environment sensor is selected from a group consisting of: a magnetometer, a light sensor, and a radio sensor. The time series data collected by the at least one environment sensor may identify a location of the at least one environment sensor.

Alternatively, or in addition, in some implementations, other types of sensors may be used in identifying the location along the reference path. Usually, WiFi hot spots are distributed at various locations inside an office building. As the strengths of the WiFi signal at different locations in the office building are not the same, the strength may be used as an indicator for the locations. Accordingly, the radio sensor equipped in the mobile device may be used for collecting the WiFi signal along the reference path. Alternatively, or in addition, the variance in the light intensity caused by indoor illumination may be considered in generating the navigation trace. Thereby the light sensor in the mobile device may also be used for collecting the time series data along the reference path.

Although the preceding paragraphs describe the steps for creating the navigation trace by using the magnetometer, those skilled in the art may work out other implementations by adopting the radio sensor and the light sensor based on the above disclosure. Further, two or more of the above sensors may be used to collect various types of reference signals. By synchronizing these reference signals at the same sampling rate, the problem of missing values from a certain reference signal may be fixed by using another reference signal.

According to implementations of the subject matter described herein, the at least one environment sensor further comprises at least one of a barometer, a gyroscope, and an accelerometer, and the time series data collected by the at least one environment sensor may identify a movement event of the at least one environment sensor. In these implementations, the movement event may comprise up/down event, a stepping event and a turning event. The navigation trace may indicate what type of movement event occurs during the movement of the at least one environment sensor along the reference path. The details of the movement event are similar as described in the preceding paragraphs.

Details for generating the navigation trace are described in the preceding paragraphs, and the generated navigation trace may be used as reference in determining a current location of the follower. According to implementations of the subject matter described herein, a new method and device for generating a navigation instruction are provided herein. In the implementations, the follower may use the navigation trace from the leader to reach the destination. Specifically, a navigation trace is obtained, where the navigation trace is represented by reference time series data collected by at least one environment sensor along a reference path from a start point to a destination. Then measured time series data is collected by at least one sensor moved along a path originated from the start point. Next, a navigation instruction is generated based on the navigation trace and the signal.

Continuing the above example, Alice is at the information desk of the building and wants to go the meeting room based on the navigation trace provided by Bob. Alice may hold her mobile device and walk near the information desk, during her walk, a measured time series data may be collected by the sensor(s) in her mobile device. At this point, the reference time series data representing the navigation trace may be compared with the measured time series data to generate a navigation instruction.

Figure 12:
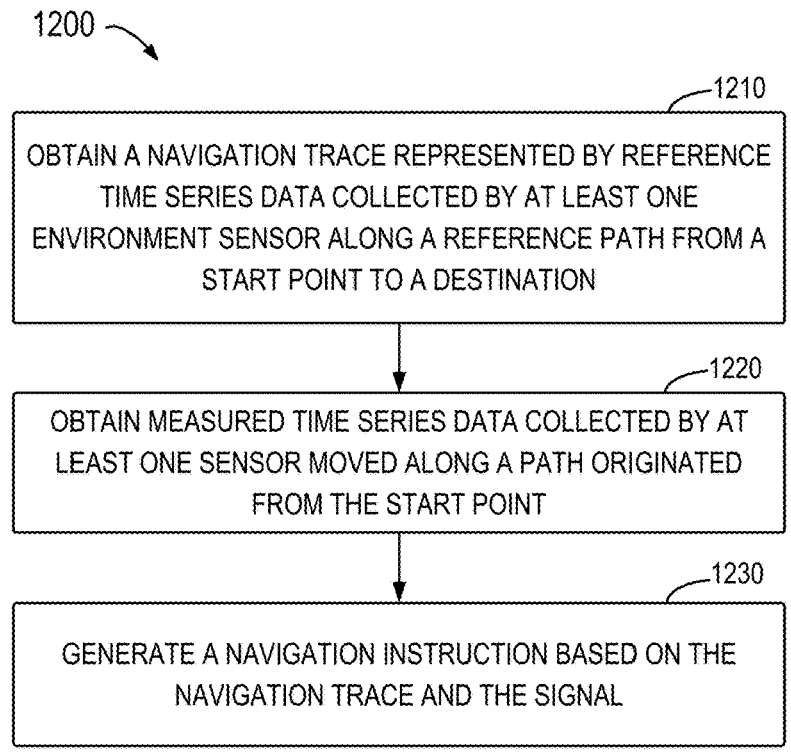
FIG. 12 is a flowchart illustrating a method for generating a navigation instruction in accordance with an example implementation of the subject matter described herein.

FIG. 12 is a flowchart illustrating a method for generating a navigation instruction in accordance with an example implementation of the subject matter described herein. At 1210, a navigation trace is obtained, where the navigation trace is represented by reference time series data collected by at least one environment sensor along a reference path from a start point to a destination. The navigation trace may be generated according to the steps of FIG. 10. Further, the navigation trace may be obtained in many ways, for example, it may be downloaded from the website, received as an attachment of an email, or be shared by a friend in the social network.

At 1220, the measured time series data is collected by at least one sensor moved along a path originated from the start point. The measured time series data may be collected by the sensor on the follower's mobile device. The measured and reference time series data may be stored in the same data structure such that comparison may be made therebetween.

At 1230, a navigation instruction is generated based on the navigation trace and the measured time series data. The navigation instruction may include the following: (1) if it is determined that the follower is travelling along the reference path, then the navigation instruction may lead the follower to move on; (2) if it is determined that the follower is significantly deviated from the reference path, then the follower may be alerted to get back to a location along the reference path.

According to implementations of the subject matter described herein, a current location of the at least one sensor may be determined by comparing the reference and measured time series data. Then, the navigation instruction may be generated for the current location based on a fragment in the navigation trace associated with the current location.

Figure 13:
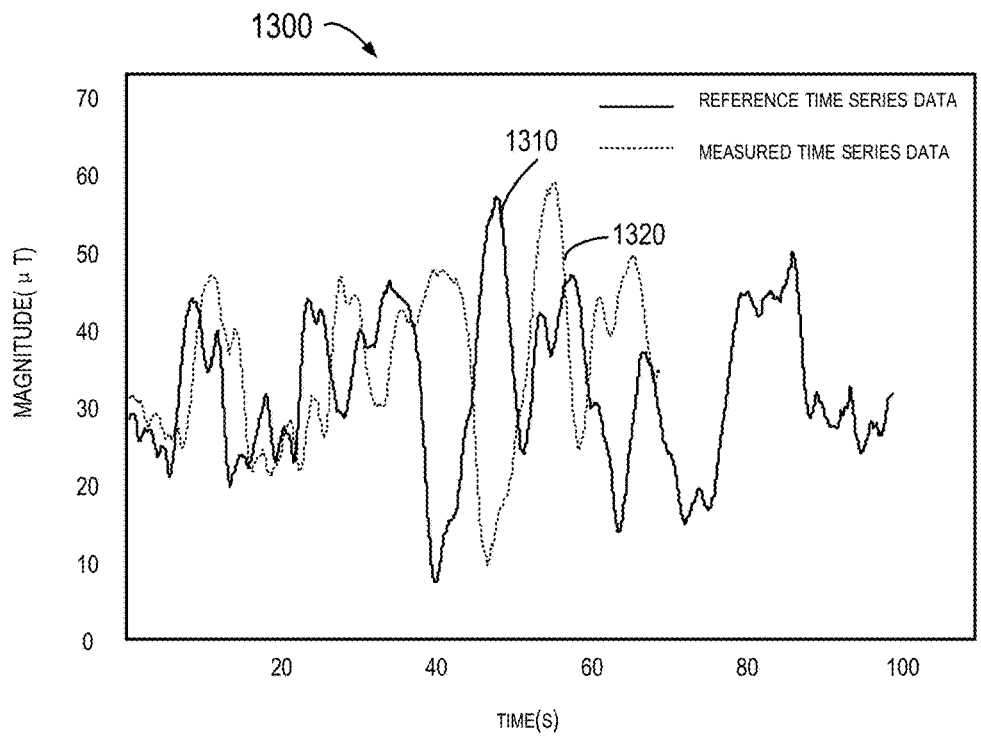
FIG. 13 illustrates a diagram block for generating a navigation instruction by comparing the reference and measured time series data in accordance with an example implementation of the subject matter described herein.

FIG. 13 illustrates a diagram block for generating a navigation instruction by comparing the reference and measured time series data in accordance with an example implementation of the subject matter described herein. Usually, time durations of the reference and measured time series data are different (as illustrated in FIG. 13), and thus the two time series data should be aligned. Multiple data processing algorithms may be adopted for aligning the curves 1310 and 1320. The reference and measured time series data may be scanned and compared. Details of the aligning are described with reference to FIG. 14.

Figure 14:
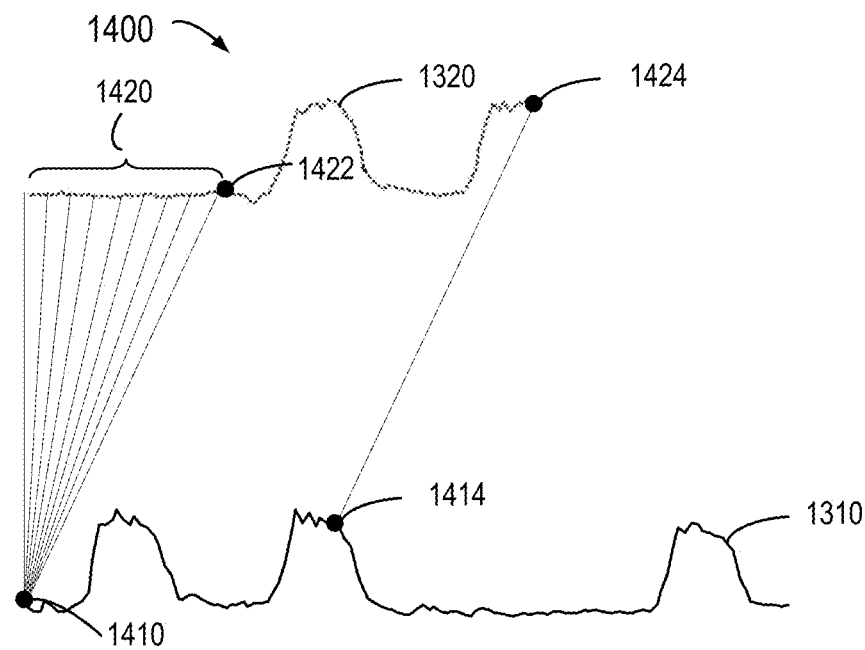
FIG. 14 illustrates a diagram block for aligning the reference time series data and measured time series data in accordance with an example implementation of the subject matter described herein.

FIG. 14 illustrates a diagram block for aligning the reference time series data 1310 and measured time series data 1320 in accordance with an example implementation of the subject matter described herein. The start location determination may be performed to find out a time point corresponding to the start point along the reference path in the measured time series data. Sliding windows may be defined in the reference and measured time series data 1310 and 1320 to find matched portions between the two curves. As illustrated in FIG. 14, point 1410 in the reference time series data 1310 corresponds to the start point in the reference path. By comparing the two curves, it is determined that the portion 1420 in the measured time series data 1320 corresponds to an area near the start point. Accordingly, the point 1422 at the back end of the portion 1420 may be determined as the start point. Alternatively, or in addition, extra data may be utilized in determining the start point. In one example, the navigation trace may include a photo of the start point, and the follower may be instructed to take a photo of the surroundings, at this point, the two photos may be compared to find out whether the follower reaches the start point. In another example, user input data may be used based on the specific requirement.

Once the start point is determined, the beginnings of the reference and measured time series data 1310 and 1320 are aligned. During the walk of the follower, the measured time series data 1310 grows gradually, and the newly collected data may be aligned to a fragment in the reference time series data 1310 to find out the current of the follower.

According to implementations of the subject matter described herein, the reference time series data may be searched for a portion matched with a current value of the measured time series data. Then, the current location of the at least one sensor may be determined based on the portion. In one implementation, Euclidean distance may be calculated between the two time series data to find the matched portion. In another implementation, Dynamic Time Warping (DTW) may be utilized for seeking to portions from the reference and measured time series data 1310 and 1320. DTW is an algorithm for measuring similarity between sequences (for example, the time series data), where dynamic programming is used to find candidate matches between the two time series data, thereby the matched point may be found in the reference time series data.

According to implementations of the subject matter described herein, in the reference time series data, a location associated with a time point corresponding to an end of the portion may be identified as the current location. As illustrated in FIG. 14, the point 1424 at the end of the measured time series data 1320 corresponds to the point 1414 in the reference time series data 1310. For details of the DTW algorithm, those skilled in the art may refer to the prior art technical documents and descriptions are omitted hereinafter.

According to implementations of the subject matter described herein, a movement event may be identified from the fragment in the navigation trace, and then the navigation instruction may be generated for the current location based on the movement event. With the gradual increase in the measured time series data during the walk of the follower, the newly increased portion may be compared to find if there is a match in the reference time series data. If the follower is on the correct path, then the newly increased portion meets the reference time series data. At this point, a match occurs between the two time series data to indicate that the follower is walking along the reference path. However, a mismatch between the two time series data indicates a deviation, in other words, the follower is deviated from the reference path. At this point, an alert may be generated to notify the follower to go back to the last location where a match occurs.

Referring to FIG. 14, the measured time series data 1320 matches the portion before the point 1414 in the reference time series data 1310. If the follower goes to a wrong direction after point 1424, then the new increase in data 1320 may not match the data 1310. At this time, the navigation instruction may alert the follower to go back to the location corresponding to the point 1424. If the follower follows the navigation instruction and goes back to the point 1424 along the reference path, then the increase associated with the deviation may be removed from the measured time series data 1320.

In addition to alerting of the deviation, the navigation instruction may indicate a specific movement that the leader makes at the current location of the follower along the reference path. According to implementations of the subject matter described herein, a pattern may be identified from the fragment in the navigation trace, where the pattern describes measurements of the at least one environment sensor associated with a specific movement. In these implementations, the specific movement may be selected from a group consisting of a stepping event, a left turning event, a right turning event, an up/down event. Further, the up/down event may sub-divided into three types: a stair up/down, an elevator up/down and an escalator up/down.

Figure 15:
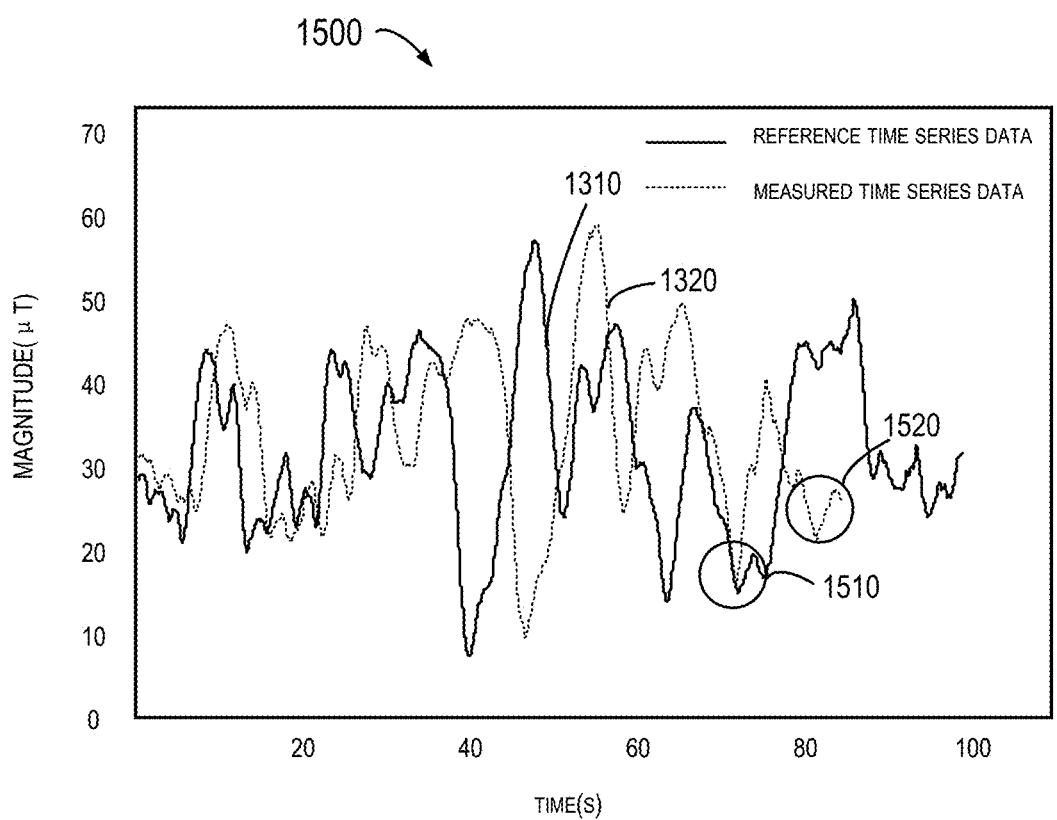
FIG. 15 illustrates a diagram block for generating a navigation instruction by comparing the reference and measured time series data in accordance with an example implementation of the subject matter described herein.

FIG. 15 illustrates a diagram block for generating a navigation instruction by comparing the reference and measured time series data in accordance with an example implementation of the subject matter described herein. According to the above method for aligning the reference and measured time series data 1310 and 1320, the two curve match, and a fragment 1510 in the reference time series data 1310 corresponds to a fragment 1520 in the measured time series data 1320. If the navigation trace indicates a specific movement (such as "a left turn") is made at a location corresponding to the fragment 1510 by the leader, then a movement event associated with "a left turn" may be identified from the navigation trace, and then the navigation instruction may indicate that a left turn is made at the current location of the follower.

According to implementations of the subject matter described herein, a stepping event may be extracted by identifying a stepping pattern from an acceleration signal included in the navigation trace collected by an accelerometer. According to implementations of the subject matter described herein, an up/down event may be extracted by identifying an up/down pattern from a barometric pressure signal included in the navigation trace collected by a barometer. According to implementations of the subject matter described herein, a turning event may be extracted by identifying a turning pattern from an orientation signal included in the navigation trace collected by a gyroscope. In these implementations, the methods for identifying the movement events are the same as described with reference to FIGS. 3 to 5 in the preceding paragraphs, and details may be omitted hereinafter.

Figure 16A:
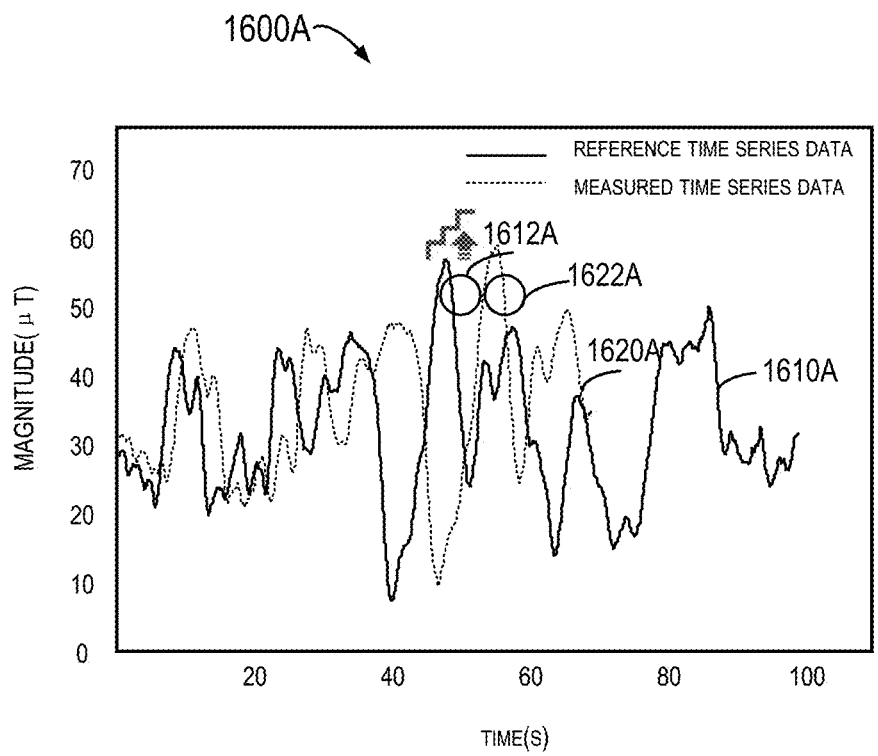
FIG. 16A illustrates a diagram block for generating a navigation instruction in accordance with an example implementation of the subject matter described herein.

FIG. 16A illustrates a diagram block 1600A for generating a navigation instruction in accordance with an example implementation of the subject matter described herein. In FIG. 16A, the reference and measured time series data 1610A and 1620A match, and a fragment 1612A in the reference time series data 1610A corresponds to a fragment 1622A in the measured time series data 1620A. In the fragment 1612A, the measurements collected by the sensor indicates the strength of the geomagnetic field falls sharply, which is a signal of going upstairs, then an up event may be identified from the navigation trace and then the navigation instruction of "going upstairs" may be generated.

Figure 16B:
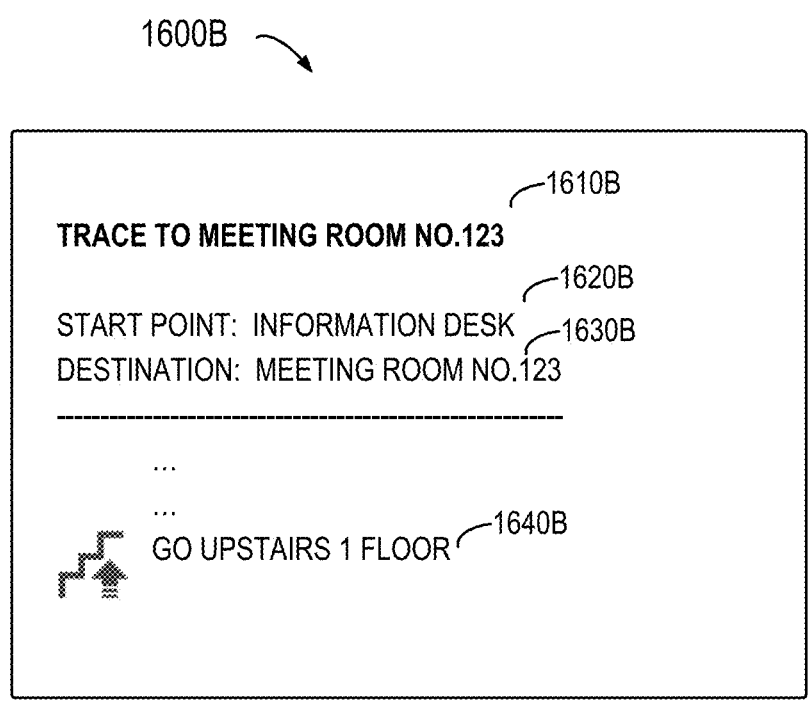
FIG. 16B illustrates an example navigation interface for displaying the navigation instruction of FIG. 16A in accordance with an example implementation of the subject matter described herein.

FIG. 16B illustrates an example navigation interface 1600B for displaying the navigation instruction of FIG. 16A in accordance with an example implementation of the subject matter described herein. As shown in FIG. 16B, the navigation instruction 1640B may indicate that the follower may go upstairs for 1 floor. The interface 1600B is similar like the interfaces as illustrated in FIGS. 7A to 7C. For example, the reference number 1610B represent a title of the navigation trace, the start point 1620B indicates the trace is started from the information desk, and the destination 1630B indicates that the trace leads to the meeting room No. 123. Although only one navigation instruction 1640B is displayed in the navigation interface 1600B, based on the preceding descriptions about finding the current location of the follower, extracting a movement event, and generating a navigation instruction, the navigations instruction may be gradually added into the interface 1600B when the follower walks ahead according to the displayed navigations instruction.

With these navigation instructions, the follower may walk along the same reference path recorded by the leader. Even if a deviation may occur during the follower's walk, an alert may be output to the follower to direct he/she back to the reference path.

Sometimes, measurements at the same location by the sensors of the leader and follower may be different. If the difference is within a predefined tolerance, the follower may continue the navigation without the calibration, otherwise the sensor of the follower should be calibrated with that of sensor to ensure the reference and the measured time series data may be properly aligned in the further processing. According to implementations of the subject matter described herein, the at least one sensor may be calibrated in response to a magnitude in the navigation trace corresponding to the start point being mismatched with a magnitude in the signal corresponding to the start point.

Figure 17:
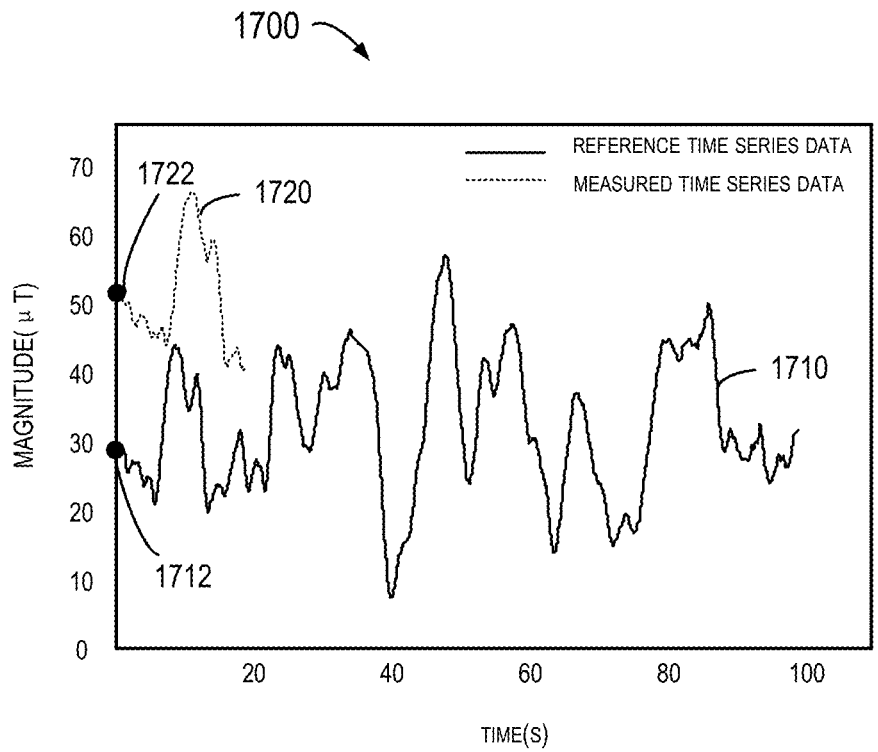
FIG. 17 is a block diagram for calibrating the at least one environment sensor in accordance with an example implementation of the subject matter described herein.

FIG. 17 is a block diagram for calibrating the at least one environment sensor in accordance with an example implementation of the subject matter described herein. In FIG. 17, the reference time series data 1710 is collected by the sensor of the leader along the reference path, and the measured time series data 1720 is collected by the sensor of the follower in an area near the start point. By comparison, the magnitude at point 1722 is significantly higher than that of point 1712, and the sensor of the follower should be calibrated. At this point, the calibration may be performed according to the traditional calibration and data correction techniques, which may make absolute values of measurements of the two sensors practical for the alignment in the further processing. In one implementation, if a magnetometer needs to be calibrated, an alert may be generated to notify the user to rotate the mobile device in "∞" shape to calibrate.

According to implementations of the subject matter described herein, the at least one sensor may be selected from a group consisting of a magnetometer, a light sensor, and a radio sensor. In this implementation, the measured time series signal may be collected by the above sensors and the method for further processing may be similar as the methods described with reference to FIGS. 12 to 15.

According to implementations of the subject matter described herein, the indoor navigation application may be run in the mobile devices. Further, the user may access the navigation service by downloading a dedicated application, or by utilizing the on-line services provided in a web site. The user may login to the service with a personal account, generate navigation instructions for a desired reference path and share the navigation instructions to a certain friend, among a group of friends, or to the public.

According to implementations of the subject matter described herein, the indoor navigation service may work across multiple operating systems. In one implementation, the navigation trace may be generated in a mobile device with the Android® system, while the follower may load the navigation trace into an IOS® system. Further, the implementations of the subject matter may be applied to other existing operation systems or to be developed in the future.

According to implementations of the subject matter described herein, the indoor navigation service may combine with the outdoor navigation. In one implementation, two navigation modes may be provided in a navigation application, where the GPS signal may be used in the outdoor navigation and the environment sensor(s) may be utilized to support the indoors.

Figure 18:
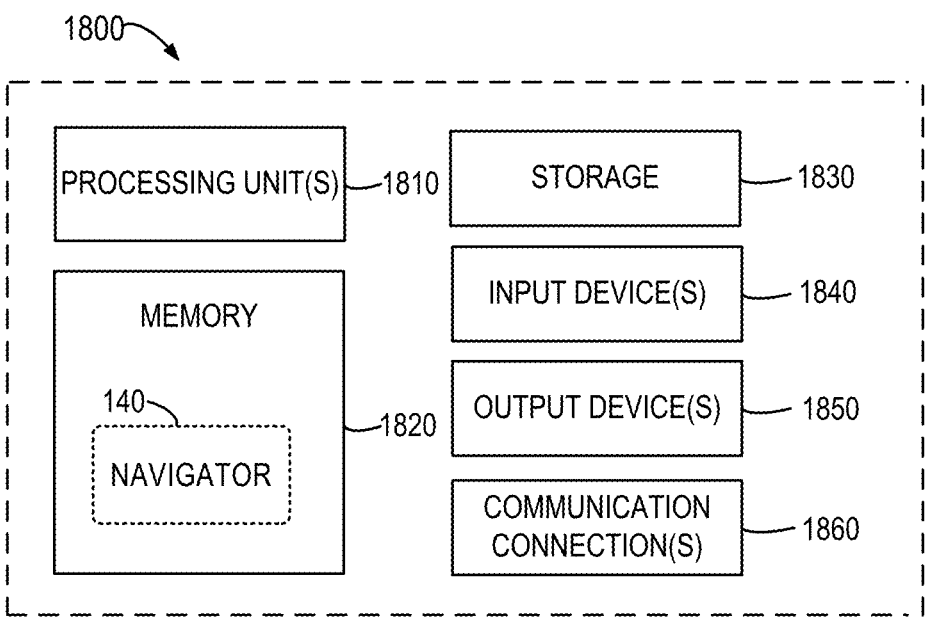
FIG. 18 is a block diagram of a device suitable for implementing one or more implementations of the subject matter described herein.

Although implementations of the subject matter are described by taking the mobile device as an example processing device, the implementations may be performed on a general processing device. FIG. 18 is a block diagram 1800 of a device suitable for implementing one or more implementations of the subject matter described herein. It is to be understood that the device 1800 is not intended to suggest any limitation as to scope of use or functionality of the subject matter described herein, as various implementations may be implemented in diverse general-purpose or special-purpose computing environments.

As shown, the device 1800 includes at least one processing unit (or processor) 1810 and a memory 1820. The processing unit 1810 executes computer-executable instructions and may be a real or a virtual processor. In a multi-processing system, multiple processing units execute computer-executable instructions to increase processing power. The memory 1820 may be volatile memory (e.g., registers, cache, RAM), non-volatile memory (e.g., ROM, EEPROM, flash memory), or some combination thereof.

In the example shown in FIG. 18, the device 1800 further includes storage 1830, one or more input devices 1840, one or more output devices 1850, and one or more communication connections 1860. An interconnection mechanism (not shown) such as a bus, controller, or network interconnects the components of the device 1800. Typically, operating system software (not shown) provides an operating environment for other software executing in the device 1800, and coordinates activities of the components of the device 1800.

The storage 1830 may be removable or non-removable, and may include computer-readable storage media such as flash drives, magnetic disks or any other medium which can be used to store information and which can be accessed within the device 1800. The input device(s) 1840 may be one or more of various different input devices. For example, the input device(s) 1840 may include a user device such as a mouse, keyboard, trackball, etc. The input device(s) 1840 may implement one or more natural user interface techniques, such as speech recognition or touch and stylus recognition. As other examples, the input device(s) 1840 may include a scanning device; a network adapter; or another device that provides input to the device 1800. The output device(s) 1850 may be a display, printer, speaker, network adapter, or another device that provides output from the device 1800. The input device(s) 1840 and output device(s) 1850 may be incorporated in a single system or device, such as a touch screen or a virtual reality system.

The communication connection(s) 1860 enables communication over a communication medium to another computing entity. Additionally, functionality of the components of the device 1800 may be implemented in a single computing machine or in multiple computing machines that are able to communicate over communication connections. Thus, the device 1800 may operate in a networked environment using logical connections to one or more other servers, network PCs, or another common network node. By way of example, and not limitation, communication media include wired or wireless networking techniques.

In accordance with implementations of the subject matter described herein, a navigator 140 may be executed on the device 1800 to allow the leader to generate a navigation trace and allow the follower to use the generated navigation trace to enjoy the indoor navigation service.

Now only for the purpose of illustration, some example implemented will be listed below.

In some implementations, the subject matter described herein may be embodied as a device. The device comprises a processing unit and a memory. The memory is coupled to the processing unit and stores instructions for execution by the processing unit. The instructions, when executed by the processing unit, cause the device to perform acts comprising: obtaining a reference signal that includes time series data collected by at least one environment sensor along a reference path from a start point to a destination; extracting a movement event by identifying a pattern from the reference signal, the pattern describing measurements of at least one environment sensor associated with a specific movement; and generating a navigation instruction indicating that the movement event occurs during a movement of the at least one environment sensor along the reference path.

In some implementations, generating a navigation instruction comprises: obtaining a geographical range along the reference path based on the identified pattern, the geographical range defined by locations of the at least one environment sensor during the movement along the reference path; and generating the navigation instruction indicating that the movement event occurs within the geographical range.

In some implementations, the at least one environment sensor comprises an accelerometer, the reference signal comprises an acceleration signal collected by the accelerometer, the pattern describes measurements of the accelerometer associated with a stepping event, and generating the navigation instruction comprises: generating the navigation instruction indicating that a stepping event occurs within the geographical range.

In some implementations, the at least one environment sensor comprises a barometer, the reference signal comprises a barometric pressure signal collected by the barometer, the pattern describes measurements of the barometer associated with an up/down event, and generating the navigation instruction comprises: generating the navigation instruction indicating that an up/down event occurs within the geographical range.

In some implementations, the at least one environment sensor comprises a gyroscope, the reference signal comprises an orientation signal collected by the gyroscope, the pattern describes measurements of the gyroscope associated with a turning event, and generating the navigation instruction comprises: generating the navigation instruction indicating that a turning event occurs within the geographical range.

In some implementations, the operations further comprise: generating an annotation associated with the movement event, where the annotation is selected from a group consisting of a comment, an image, a video, an audio, and metadata.

In some implementations, the operations further comprise: extracting a second movement event by identifying a second pattern from the reference signal, the pattern describes measurements of at least one environment sensor associated with a second movement; generating a second navigation instruction indicating that the second movement event occurs during the movement of the at least one environment sensor along the reference path; and creating an instruction list including the navigation instruction and the second navigation instruction.

In some implementations, the operations further comprise: reversing the navigation instruction and the second navigation instruction included in the instruction list to provide a navigation along a reversed path from the destination to the start point; and sharing the instruction list.

In some implementations, the operations further comprise: creating a human readable summary for the instruction list.

In some implementations, the at least one environment sensor is deployed on a movable entity, and obtaining a reference signal comprises obtaining measurements collected by the at least one environment sensor at a predefined interval during a movement of the entity along the reference path to form the reference signal.

In some implementations, the operations further comprise providing the navigation instruction without a map of the reference path.

In some implementations, the subject matter described herein may be embodied as a computer-implemented method comprising: obtaining a reference signal that includes time series data collected by at least one environment sensor along a reference path from a start point to a destination; extracting a movement event by identifying a pattern from the reference signal, the pattern describing measurements of at least one environment sensor associated with a specific movement; and generating a navigation instruction indicating that the movement event occurs during a movement of the at least one environment sensor along the reference path.

In some implementations, the method further comprises: extracting a second movement event by identifying a second pattern from the reference signal, the pattern describing measurements of at least one environment sensor associated with a second movement; generating a second navigation instruction indicating that the second movement event occurs during the movement of the at least one environment sensor along the reference path; and creating an instruction list including the navigation instruction and the second navigation instruction.

In some implementations, the method further comprises at least one of the following: reversing the navigation instruction and the second navigation instruction included in the instruction list to provide a navigation along a reversed path from the destination to the start point; or sharing the instruction list.

In some implementations, the at least one environment sensor is deployed on a movable entity, and obtaining a reference signal comprises: obtaining measurements collected by the at least one environment sensor at a predefined interval during a movement of the entity along the reference path to form the reference signal.

In some implementations, the subject matter described herein may be embodied as a device. The device comprises a processing unit and a memory. The memory is coupled to the processing unit and stores instructions for execution by the processing unit. The instructions, when executed by the processing unit, cause the device to perform acts comprising: obtaining a reference signal that includes time series data collected by at least one environment sensor along a reference path from a start point to a destination; creating a navigation trace for the reference path based on the obtained reference signal, magnitudes at locations of the navigation trace reflecting measurements collected by the at least one environment sensor at respective time points of the reference signal.

In some implementations, the at least one environment sensor is deployed on a movable entity, and the obtaining a reference signal comprises: obtaining measurements collected by the at least one environment sensor at a predefined interval during a movement of the entity along the reference path to form the reference signal.

In some implementations, creating a navigation trace comprises: for a time point of the reference signal, associating a measurement at the time point of the reference signal with a location at which the at least one environment sensor being located at the time point to generate a magnitude at the location.

In some implementations, the operations further comprise at least one of the following: reversing the navigation trace to provide navigation along a reversed path from the destination to the start point; or sharing the navigation trace.

In some implementations, the at least one environment sensor is selected from a group consisting of: a magnetometer, a light sensor, and a radio sensor, and the time series data collected by the at least one environment sensor identifies a location of the at least one environment sensor.

In some implementations, the at least one environment sensor further comprises at least one of a barometer, a gyroscope, and an accelerometer, and the time series data collected by the at least one environment sensor further identifies a movement event of the at least one environment sensor.

In some implementations, the subject matter described herein may be embodied as a device. The device comprises a processing unit and a memory. The memory is coupled to the processing unit and stores instructions for execution by the processing unit. The instructions, when executed by the processing unit, cause the device to perform acts comprising: obtaining a navigation trace represented by reference time series data collected by at least one environment sensor along a reference path from a start point to a destination; obtaining measured time series data collected by at least one sensor moved along a path originated from the start point; and generating a navigation instruction based on the navigation trace and the signal.

In some implementations, generating a navigation instruction comprises: determining a current location of the at least one sensor by comparing the reference and measured time series data; and generating the navigation instruction for the current location based on a fragment in the navigation trace associated with the current location.

In some implementations, determining a current location of the at least one sensor comprises: searching the reference time series data for a portion matched with a current value of the measured time series data; and determining the current location of the at least one sensor based on the portion.

In some implementations, determining the current location of the at least one sensor based on the portion comprises: identifying a location, in the reference time series data, associated with a time point corresponding to an end of the portion as the current location.

In some implementations, generating the navigation instruction for the current location comprises: identifying a movement event from the fragment in the navigation trace; and generating the navigation instruction for the current location based on the movement event.

In some implementations, identifying a movement event comprises: identifying a pattern from the fragment in the navigation trace, the pattern describing measurements of the at least one environment sensor associated with a specific movement.

In some implementations, extracting the movement event comprises any of: extracting a stepping event by identifying a stepping pattern from an acceleration signal included in the navigation trace collected by an accelerometer; extracting an up/down event by identifying an up/down pattern from a barometric pressure signal included in the navigation trace collected by a barometer; and extracting a turning event by identifying a turning pattern from an orientation signal included in the navigation trace collected by a gyroscope.

In some implementations, the operations further comprise: calibrating the at least one sensor in response to a magnitude in the navigation trace corresponding to the start point being mismatched with a magnitude in the signal corresponding to the start point.

In some implementations, the subject matter described herein may be embodied as a computer-implemented method, the method comprising: obtaining a reference signal that includes time series data collected by at least one environment sensor along a reference path from a start point to a destination; creating a navigation trace for the reference path based on the obtained reference signal, magnitudes at locations of the navigation trace reflecting measurements collected by the at least one environment sensor at respective time points of the reference signal.

In some implementations, the at least one environment sensor is deployed on a movable entity, and the obtaining a reference signal comprises: obtaining measurements collected by the at least one environment sensor at a predefined interval during a movement of the entity along the reference path to form the reference signal.

In some implementations, creating a navigation trace comprises: for a time point of the reference signal, associating a measurement at the time point of the reference signal with a location at which the at least one environment sensor being located at the time point to generate a magnitude at the location.

In some implementations, the method further comprises at least one of the following: reversing the navigation trace to provide a navigation along a reversed path from the destination to the start point; or sharing the navigation trace.

In some implementations, the subject matter described herein may be embodied as a computer-implemented method, the method comprises: obtaining a navigation trace represented by reference time series data collected by at least one environment sensor along a reference path from a start point to a destination; obtaining measured time series data collected by at least one sensor moved along a path originated from the start point; and generating a navigation instruction based on the navigation trace and the measured time series data.

In some implementations, the at least one sensor is selected from a group consisting of a magnetometer, a light sensor, and a radio sensor.

Implementations of the subject matter described herein may further include one or more computer program products being tangibly stored on a non-transient machine-readable medium and comprising machine-executable instructions. The instructions, when executed on a device, causing the device to carry out one or more processes as described above.

In general, the various example implementations may be implemented in hardware or special purpose circuits, software, logic or any combination thereof. Some aspects may be implemented in hardware, while other aspects may be implemented in firmware or software which may be executed by a controller, microprocessor or other computing device. While various aspects of the example implementations of the subject matter described herein are illustrated and described as block diagrams, flowcharts, or using some other pictorial representation, it will be to be understood that the blocks, apparatus, systems, techniques or methods described herein may be implemented in, as non-limiting examples, hardware, software, firmware, special purpose circuits or logic, general purpose hardware or controller or other computing devices, or some combination thereof.

In the context of the subject matter described herein, a machine readable medium may be any tangible medium that can contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Computer program code for carrying out methods of the subject matter described herein may be written in any combination of one or more programming languages. These computer program codes may be provided to a processor of a general purpose computer, special purpose computer, or other programmable data processing apparatus, such that the program codes, when executed by the processor of the computer or other programmable data processing apparatus, cause the functions or operations specified in the flowcharts and/or block diagrams to be implemented. The program code may execute entirely on a computer, partly on the computer, as a stand-alone software package, partly on the computer and partly on a remote computer or entirely on the remote computer or server.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of any disclosure or of what may be claimed, but rather as descriptions of features that may be specific to particular implementations of particular disclosures. Certain features that are described in this specification in the context of separate implementations can also be implemented in combination in a single implementation. Conversely, various features that are described in the context of a single implementation can also be implemented in multiple implementations separately or in any suitable sub-combination.

Various modifications, adaptations to the foregoing example implementations of this disclosure may become apparent to those skilled in the relevant arts in view of the foregoing description, when read in conjunction with the accompanying drawings. Any and all modifications will still fall within the scope of the non-limiting and example implementations of this disclosure. Furthermore, other implementations of the disclosures set forth herein will come to mind to one skilled in the art to which these implementations of the disclosure pertain having the benefit of the teachings presented in the foregoing descriptions and the drawings.

Therefore, it will be to be understood that the implementations of the disclosure are not to be limited to the specific implementations disclosed and that modifications and other implementations are intended to be included within the scope of the appended claims. Although specific terms are used herein, they are used in a generic and descriptive sense only and not for purposes of limitation.

What is claimed is:

1. A device comprising:
   a processing unit; and
   a memory coupled to the processing unit and storing instructions for execution by the processing unit, the instructions, upon execution by the processing unit, causing the device to perform acts comprising:
   obtaining a path data set that includes time series data of measurements collected only by at least one environment non-GPS sensor along a previously traveled path, wherein the at least one environment non-GPS sensor is selected from a group consisting of a magnetometer, a light sensor, a barometer, a gyroscope, an accelerometer, and a radio sensor; and
   creating a navigation trace of the previously traveled path based at least on the obtained path data set, the creating the navigation trace comprising:
   identifying a pattern, from the obtained path data set that describes measurements of the at least one environment non-GPS sensor associated with a specific movement, the specific movement is a movement event of a plurality of movement events of the previously traveled path, and
   identifying a geographical range associated with the previously traveled path.

2. The device of claim 1, wherein the at least one environment non-GPS sensor is deployed on a movable entity, and the obtained path data set is collected by the at least one environment non-GPS sensor at an interval during a movement of the entity along the previously traveled path to form the path data set.

3. The device of claim 1, wherein the creating the navigation trace comprises:
   for a time point of the path data set, associating a measurement at the time point of the path data set with a location at which the at least one environment non-GPS sensor being located at the time point to generate a magnitude at the location.

4. The device of claim 1, wherein the instructions, upon execution by the processing unit, further cause the device to perform further acts comprising:
   reversing the navigation trace to provide navigation along a reversed path from a destination to a start point.

5. The device of claim 1, wherein the time series data collected by the at least one environment non-GPS sensor identifies a location of the at least one environment non-GPS sensor.

6. The device of claim 5, wherein the time series data collected by the at least one environment non-GPS sensor further identifies another movement event of the at least one environment non-GPS sensor.

7. The device of claim 1, wherein the specific movement corresponds to a rise or drop in elevation of the at least one environment non-GPS sensor.

8. The device of claim 1, wherein the instructions, upon the execution by the processing unit, further causes the device to perform further acts comprising:
   generating an alert responsive to a difference between additional time series data of measurements collected by a second environmental sensor and the time series data of measurements collected by the at least one environment non-GPS sensor exceeding a threshold.

9. The device of claim 1, wherein the instructions, upon execution by the processing unit, further causes the device to perform further acts comprising:
   sharing the navigation trace.

10. A device comprising:
    a processing unit; and
    a memory coupled to the processing unit and storing instructions for execution by the processing unit, the instructions, upon execution by the processing unit, causing the device to perform operations comprising:
    obtaining a path data set that includes time series data of measurements collected only by at least one indoor environment non-GPS sensor along a previously traveled path, wherein the at least one indoor environment non-GPS sensor is selected from a group consisting of a magnetometer, a light sensor, a barometer, a gyroscope, an accelerometer, and a radio sensor; and
    based at least on the obtained path data set, creating a navigation trace of the previously traveled path, creating the navigation trace comprising:
    identifying a pattern, from the obtained path data set, that describes measurements of at least one indoor environment non-GPS sensor associated with a specific movement of the previously traveled path, and
    identifying a geographical range associated with the previously traveled path.

11. The device of claim 10 further comprising:
generating a navigation instruction based on the navigation trace.

12. The device of claim 10, wherein the time series data collected by the at least one indoor environment non-GPS sensor identifies an indoor location of the at least one indoor environment non-GPS sensor.

13. The device of claim 10, wherein a measurement collected by at least one indoor environment non-GPS sensor determines any of:
an indoor stepping event by identifying a stepping pattern from an acceleration signal; and
an indoor up/down event by identifying an up/down pattern from a barometric pressure signal.

14. The device of claim 10, wherein the at least one indoor environment non-GPS sensor is deployed on a movable entity, and the obtained path data set is collected by the at least one indoor environment non-GPS sensor at an interval during a movement of the entity along the previously traveled path to form the path data set.

15. The device of claim 10 further comprising:
reversing the navigation trace to provide a navigation along a reversed path from a destination to a start point.

16. The device of claim 10 further comprising:
sharing the navigation trace.

17. A computer-implemented method comprising:
obtaining a path data set that includes time series data collected only by at least one environment non-GPS sensor along a previously traveled path, wherein the at least one environment non-GPS sensor is selected from a group consisting of a magnetometer, a light sensor, a barometer, a gyroscope, an accelerometer, and a radio sensor; and
creating a navigation trace of the previously traveled path based at least on the obtained path data set, creating the navigation trace comprising:
identifying a pattern, from the obtained path data set that describes measurements of the at least one environment non-GPS sensor associated with a specific movement, the specific movement is a movement event of a plurality of movement events of the previously traveled path, and
identifying a geographical range associated with the previously traveled path.

18. The method of claim 17, wherein the at least one environment non-GPS sensor is deployed on a movable entity, and the obtained path data set is collected by the at least one environment non-GPS sensor at an interval during a movement of the entity along the previously traveled path to form the path data set.

19. The method of claim 17, wherein the creating the navigation trace comprises:
for a time point of the path data set, associating a measurement at the time point of the path data set with a location at which the at least one environment non-GPS sensor is located at the time point to generate a magnitude at the location.

20. The method of claim 17, wherein
the time series data collected by the at least one environment non-GPS sensor identifies a location of the at least one environment non-GPS sensor.

\* \* \* \* \*